(12) United States Patent
Yamazaki et al.

(10) Patent No.: US 9,728,556 B2
(45) Date of Patent: Aug. 8, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Kenichi Okazaki, Tochigi (JP); Masahiko Hayakawa, Tochigi (JP); Shinpei Matsuda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/296,395

(22) Filed: Oct. 18, 2016

(65) Prior Publication Data
US 2017/0040348 A1 Feb. 9, 2017

Related U.S. Application Data

(63) Continuation of application No. 14/272,742, filed on May 8, 2014, now Pat. No. 9,508,861.

(30) Foreign Application Priority Data

May 16, 2013 (JP) ................................. 2013-103708

(51) Int. Cl.
*H01L 27/12* (2006.01)
*G02F 1/1343* (2006.01)
*G02F 1/1368* (2006.01)

(52) U.S. Cl.
CPC ........ *H01L 27/1225* (2013.01); *G02F 1/1368* (2013.01); *G02F 1/134309* (2013.01); *H01L 27/124* (2013.01); *H01L 27/1237* (2013.01)

(58) Field of Classification Search
CPC ......... H01L 29/78648; H01L 29/78696; H01L 29/7869; G02F 1/1368; G02F 2001/13685
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101866952 A 10/2010
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Dennis Y Kim
(74) *Attorney, Agent, or Firm* — Robinson Intellectual Property Law Office; Eric J. Robinson

(57) ABSTRACT

A semiconductor device which includes an oxide semiconductor and in which formation of a parasitic channel due to a gate BT stress is suppressed is provided. Further, a semiconductor device including a transistor having excellent electrical characteristics is provided. The semiconductor device includes a transistor having a dual-gate structure in which an oxide semiconductor film is provided between a first gate electrode and a second gate electrode; gate insulating films are provided between the oxide semiconductor film and the first gate electrode and between the oxide semiconductor film and the second gate electrode; and in the channel width direction of the transistor, the first or second gate electrode faces a side surface of the oxide semiconduc-
(Continued)

tor film with the gate insulating film between the oxide semiconductor film and the first or second gate electrode.

19 Claims, 19 Drawing Sheets

(56) References Cited

U.S. PATENT DOCUMENTS

| | | |
|---|---|---|
| 6,043,511 A | 3/2000 | Kim |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,274,079 B2 | 9/2012 | Yamazaki |
| 8,384,080 B2 | 2/2013 | Taniguchi et al. |
| 8,674,354 B2 | 3/2014 | Yamazaki |
| 8,692,252 B2 | 4/2014 | Takata et al. |
| 8,790,960 B2 | 7/2014 | Yamazaki |
| 2001/0046027 A1 | 11/2001 | Tai et al. |
| 2002/0056838 A1 | 5/2002 | Ogawa |
| 2002/0076845 A1 | 6/2002 | Noritake et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199880 A1 | 9/2005 | Hoffman et al. |
| 2005/0199881 A1 | 9/2005 | Hoffman et al. |
| 2005/0199959 A1 | 9/2005 | Chiang et al. |
| 2005/0199960 A1 | 9/2005 | Hoffman et al. |
| 2005/0199961 A1 | 9/2005 | Hoffman et al. |
| 2005/0199967 A1 | 9/2005 | Hoffman |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163655 A1 | 7/2006 | Hoffman et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018163 A1 | 1/2007 | Chiang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152214 A1 | 7/2007 | Hoffman et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001184 A1 | 1/2008 | Genrikh et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0044711 A1 | 2/2010 | Imai |
| 2010/0065844 A1 | 3/2010 | Tokunaga |
| 2010/0078634 A1 | 4/2010 | Hoffman et al. |
| 2010/0092800 A1 | 4/2010 | Itagaki et al. |
| 2010/0109002 A1 | 5/2010 | Itagaki et al. |
| 2010/0219411 A1 | 9/2010 | Hoffman et al. |
| 2010/0244022 A1 | 9/2010 | Takahashi et al. |
| 2010/0264412 A1 | 10/2010 | Yamazaki et al. |
| 2011/0024755 A1 | 2/2011 | Korenari et al. |
| 2011/0049509 A1 | 3/2011 | Takahashi et al. |
| 2011/0109351 A1 | 5/2011 | Yamazaki et al. |
| 2011/0175674 A1 | 7/2011 | Shimizu et al. |
| 2011/0193077 A1 | 8/2011 | Yamazaki |
| 2011/0240987 A1 | 10/2011 | Lee et al. |
| 2011/0266542 A1 | 11/2011 | Ryu et al. |
| 2011/0269266 A1 | 11/2011 | Yamazaki |
| 2011/0284852 A1 | 11/2011 | Kim et al. |
| 2011/0299004 A1 | 12/2011 | Liu et al. |
| 2011/0299318 A1 | 12/2011 | Kaneko et al. |
| 2011/0310650 A1 | 12/2011 | Kaneko et al. |
| 2012/0007158 A1 | 1/2012 | Yoon et al. |
| 2012/0032173 A1 | 2/2012 | Sato et al. |
| 2012/0085999 A1 | 4/2012 | Song et al. |
| 2012/0146713 A1 | 6/2012 | Kim et al. |
| 2012/0153277 A1 | 6/2012 | Yaginuma et al. |
| 2012/0208318 A1 | 8/2012 | Hoffman et al. |
| 2013/0009145 A1 | 1/2013 | Jeon et al. |
| 2013/0009209 A1 | 1/2013 | Yamazaki |
| 2013/0037798 A1 | 2/2013 | Wong et al. |

(56) References Cited

U.S. PATENT DOCUMENTS

| | | | |
|---|---|---|---|
| 2013/0069059 A1 | 3/2013 | Yamazaki | |
| 2013/0299821 A1 | 11/2013 | Yamazaki | |

FOREIGN PATENT DOCUMENTS

| | | | |
|---|---|---|---|
| EP | 2226847 A | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-165528 A | 6/2006 | |
| JP | 2010-267955 A | 11/2010 | |
| JP | 2011-124360 A | 6/2011 | |
| JP | 2011-138934 A | 7/2011 | |
| JP | 2011-181913 A | 9/2011 | |
| JP | 2011-249788 A | 12/2011 | |
| JP | 2013-038400 A | 2/2013 | |
| KR | 2010-0114842 A | 10/2010 | |
| KR | 2012-0117914 A | 10/2012 | |
| TW | 201108417 | 3/2011 | |
| TW | 201205684 | 2/2012 | |
| TW | 201342622 | 10/2013 | |
| WO | WO-2004/114391 | 12/2004 | |
| WO | WO-2011/096263 | 8/2011 | |
| WO | WO-2011/135987 | 11/2011 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digests of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNo Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digests of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IgZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura. M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 Inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a $Zn_4s$ conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/062900) Dated Aug. 5, 2014.

Written Opinion (Application No. PCT/JP2014/062900) Dated Aug. 5, 2014.

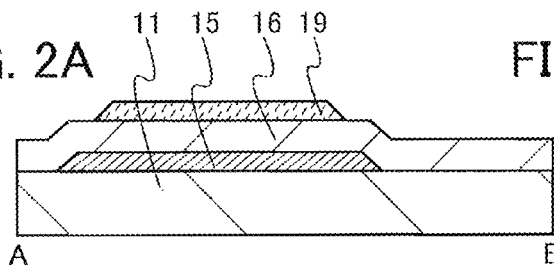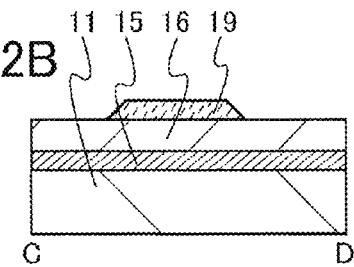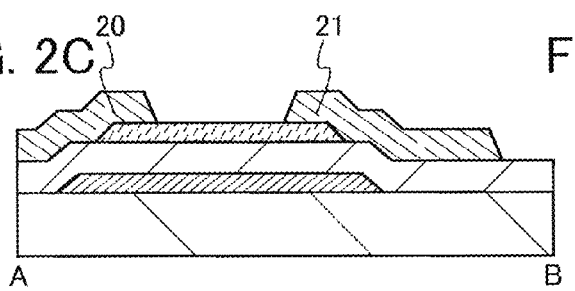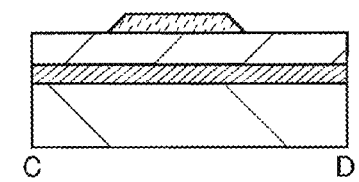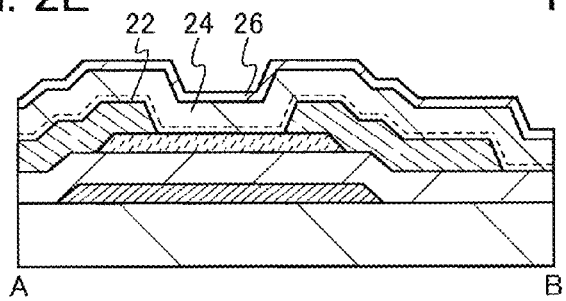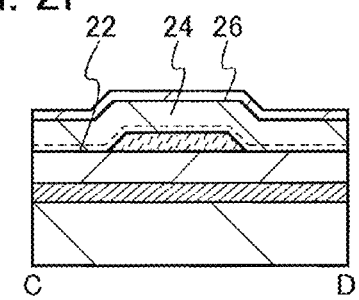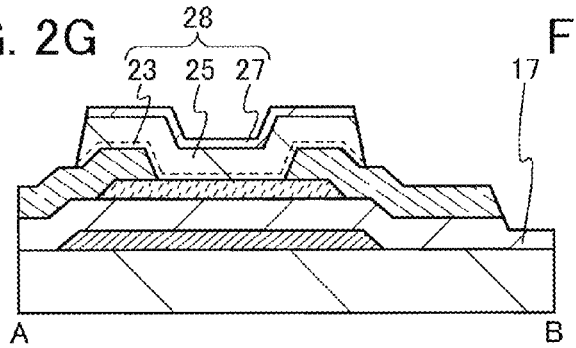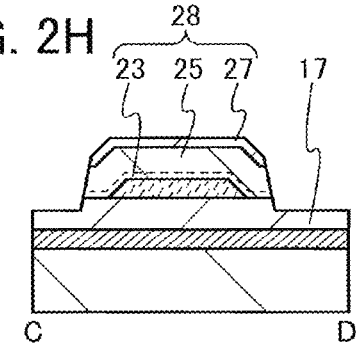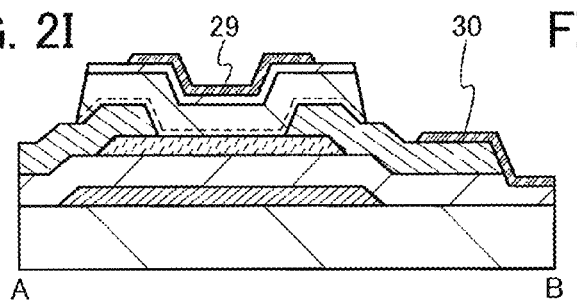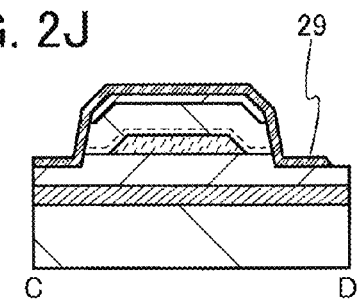

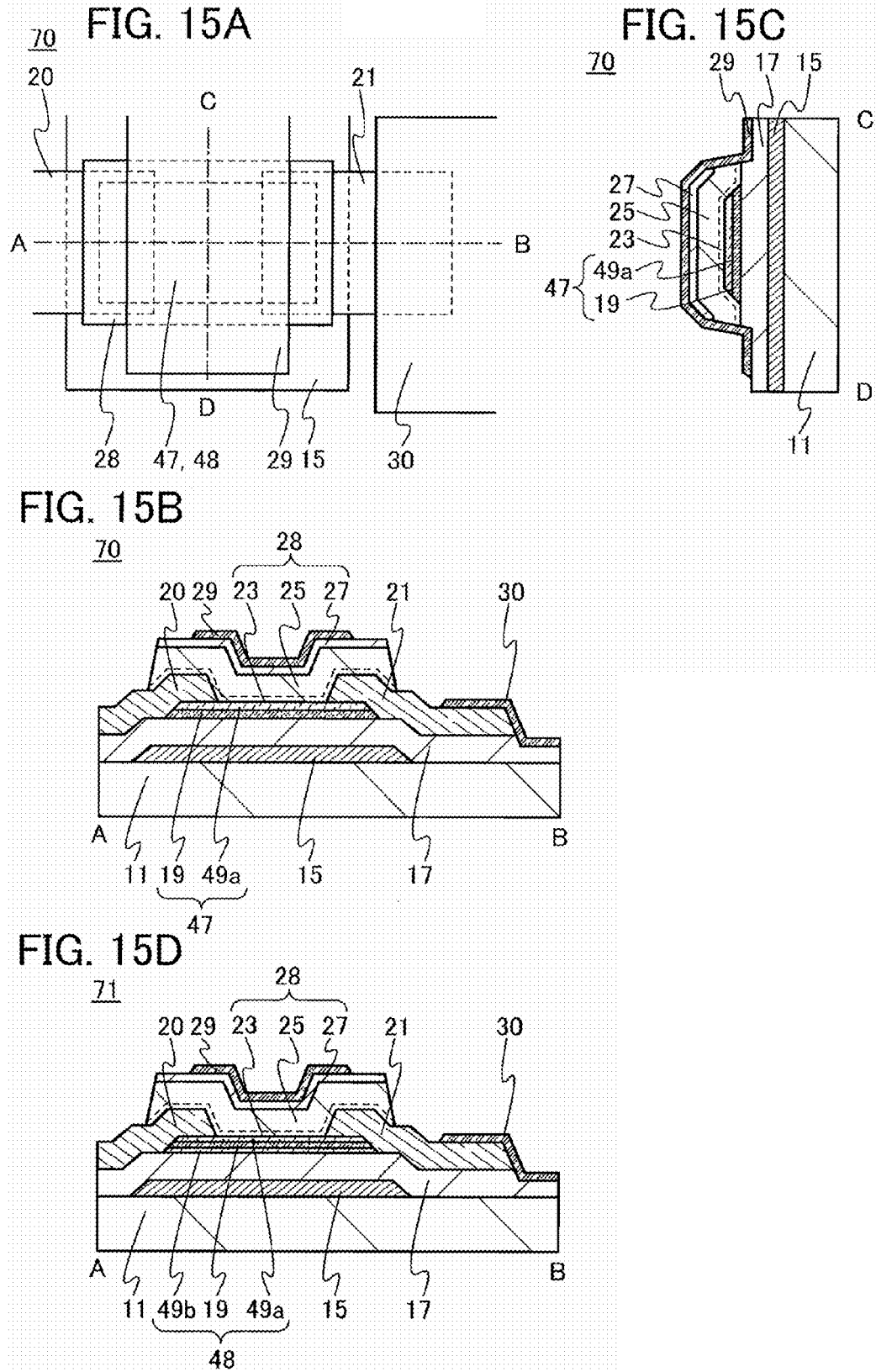

FIG. 17
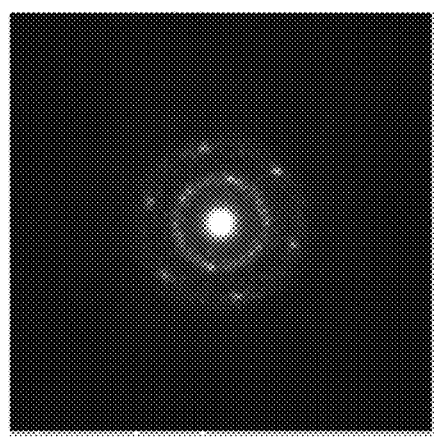
nc-OS measurement position 1
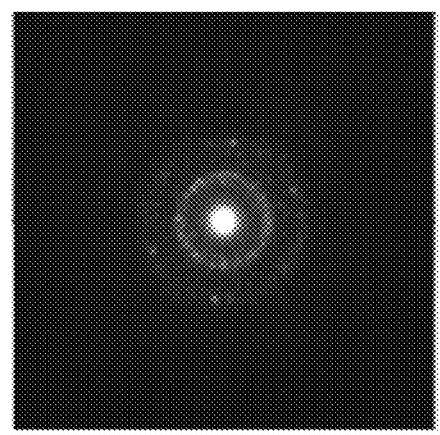
nc-OS measurement position 3
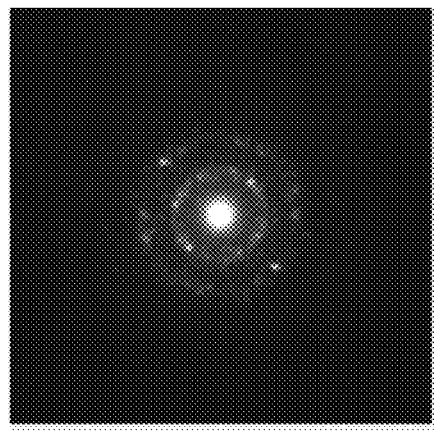
nc-OS measurement position 2
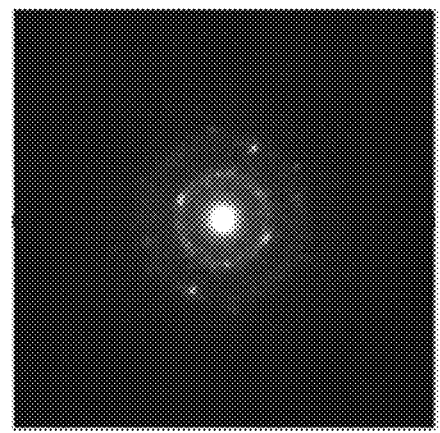
nc-OS measurement position 4

SEMICONDUCTOR DEVICE

TECHNICAL FIELD

The present invention relates to a semiconductor device having a transistor including an oxide semiconductor film and a method for manufacturing the semiconductor device.

BACKGROUND ART

Attention has been focused on a technique for forming a transistor using a semiconductor thin film formed over a substrate (also referred to as a thin film transistor (TFT)). Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer of the transistor has been disclosed (see Patent Document 1).

Further, a technique of improving carrier mobility by forming stacked oxide semiconductor layers has been disclosed (see Patent Documents 2 and 3).

REFERENCE

Patent Document

[Patent Document 1] Japanese Published Patent Application No. 2006-165528
[Patent Document 2] Japanese Published Patent Application No. 2011-138934
[Patent Document 3] Japanese Published Patent Application No. 2011-124360

DISCLOSURE OF INVENTION

In a transistor including an oxide semiconductor film, a large number of defects in the oxide semiconductor film cause poor electrical characteristics of the transistor and cause an increase in the amount of change in threshold voltage due to passage of time or a stress test (e.g., a bias-temperature (BT) stress test).

For example, in transistor characteristics (drain current-gate voltage curve (Id-Vg curve)) after application of a gate BT stress (in particular, positive bias) to a transistor formed using an oxide semiconductor, a defect in which drain current is increased gradually at the threshold voltage is caused. This may result from a parasitic channel formed at a side surface of the oxide semiconductor film that overlaps with a gate electrode by a change of the side surface of the oxide semiconductor into n-type. Defects are formed at the side surface of the oxide semiconductor film because of damage due to processing for element isolation, and the side surface of the oxide semiconductor film is polluted by attachment of impurities, or the like. Thus, when stress such as an electric field is applied to the region, an end portion of the oxide semiconductor film is easily activated to be n-type (have low resistance), whereby a parasitic channel is formed.

Further, as defects of the oxide semiconductor film, oxygen vacancies are given. For example, in a transistor formed using an oxide semiconductor film including oxygen vacancies, the threshold voltage is likely to shift in the negative direction to have normally-on characteristics. This is because charges are generated owing to oxygen vacancies in the oxide semiconductor film and the resistance is thus reduced. The transistor having normally-on characteristics causes various problems in that malfunction is likely to be caused when a semiconductor device is in operation and that power consumption is increased when a semiconductor device is not in operation. Further, there is a problem in that the amount of change in electrical characteristics, typically in threshold voltage, of the transistor is increased by passage of time or a stress test.

One object of one embodiment of the present invention is to provide a semiconductor device which includes an oxide semiconductor and in which formation of a parasitic channel due to a gate BT stress is suppressed. Further, a semiconductor device including a transistor having excellent electrical characteristics is provided.

One embodiment of the present invention is a semiconductor device including a transistor having a dual-gate structure in which an oxide semiconductor film is provided between a first gate electrode and a second gate electrode; gate insulating films are provided between the oxide semiconductor film and the first gate electrode and between the oxide semiconductor film and the second gate electrode; and in the channel width direction of the transistor, the first or second gate electrode faces a side surface of the oxide semiconductor film with the gate insulating film between the oxide semiconductor film and the first or second gate electrode.

Another embodiment of the present invention is a semiconductor device including a transistor. The transistor includes a first gate electrode facing one surface of an oxide semiconductor film; a second gate electrode facing the other surface of the oxide semiconductor film; a first gate insulating film between the oxide semiconductor film and the first gate electrode; a second gate insulating film between the oxide semiconductor film and the second gate electrode; and a pair of electrodes in contact with the oxide semiconductor film. In the channel width direction of the transistor, the first or second gate electrode faces a side surface of the oxide semiconductor film with the first or second gate insulating film between the oxide semiconductor film and the first or second gate electrode.

Note that the gate insulating film, the first gate insulating film, or the second gate insulating film may each be isolated from a gate insulating film, a first gate insulating film, or a second gate insulating film formed in an adjacent transistor.

The gate insulating film, the first gate insulating film, or the second gate insulating film may have a plurality of openings so that the oxide semiconductor film is provided between the plurality of openings when seen from a direction perpendicular to a surface of any of these films.

Furthermore, the first gate electrode may be connected to the second gate electrode.

In addition, a conductive film connected to one of the pair of electrodes may be provided. The conductive film serves as a pixel electrode.

Further, the gate insulating film, the first gate insulating film, or the second gate insulating film may include an oxide insulating film containing a higher proportion of oxygen than that of oxygen in the stoichiometric composition. Note that the oxide insulating film containing a higher proportion of oxygen than that of oxygen in the stoichiometric composition is an oxide insulating film of which the amount of released oxygen converted into oxygen atoms is greater than or equal to $1.0 \times 10^{18}$ atoms/cm$^3$, or greater than or equal to $3.0 \times 10^{20}$ atoms/cm$^3$ in thermal desorption spectroscopy (TDS) analysis.

When the first or second gate electrode faces a side surface of the oxide semiconductor film with the gate insulating film therebetween in the channel width direction of the transistor, formation of a parasitic channel at the side surface of the oxide semiconductor film and its vicinity is suppressed because of an electric field of the first or second gate electrode. As a result, drain current is drastically increased at the threshold voltage, so that the transistor has excellent electrical characteristics. Further, in the channel width direction of the transistor, the minimum distance between the side surface of the oxide semiconductor film and the second gate electrode is preferably greater than or equal to 0.5 μm and less than or equal to 1.5 μm. In that case, a short circuit between the oxide semiconductor film and the second gate electrode can be prevented, which can increase yield.

Further, when the gate insulating film, the first gate insulating film, or the second gate insulating film includes an oxide insulating film containing a higher proportion of oxygen than that of oxygen in the stoichiometric composition, oxygen contained in the gate insulating film, the first gate insulating film, or the second gate insulating film is transferred to the oxide semiconductor film, which can reduce oxygen vacancies in the oxide semiconductor film. As a result, the transistor has normally-off characteristics. Further, the amount of change in electrical characteristics, typically in threshold voltage, of the transistor due to passage of time or a stress test can be reduced.

According to one embodiment of the present invention, a semiconductor device which includes an oxide semiconductor and in which formation of a parasitic channel due to a gate BT stress is suppressed can be provided. Further, a semiconductor device including a transistor having excellent electrical characteristics can be provided.

BRIEF DESCRIPTION OF DRAWINGS

FIGS. 2A to 2J are cross-sectional views illustrating one embodiment of a method for manufacturing a transistor.

FIGS. 15A to 15D are a top view and cross-sectional views illustrating one embodiment of a transistor.

FIG. 17 shows nanobeam electron diffraction patterns of an oxide semiconductor.

BEST MODE FOR CARRYING OUT THE INVENTION

Figure 1A:
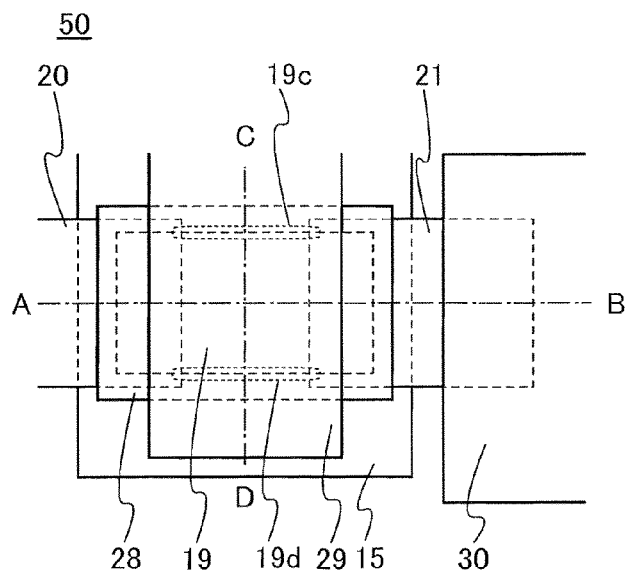
FIGS. 1A to 1C are a top view and cross-sectional views illustrating one embodiment of a transistor.

Embodiments of the present invention are described below in detail with reference to drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed.

Embodiment 1

In this embodiment, a semiconductor device that is one embodiment of the present invention and a manufacturing method thereof are described with reference to drawings.

Figure 1C:
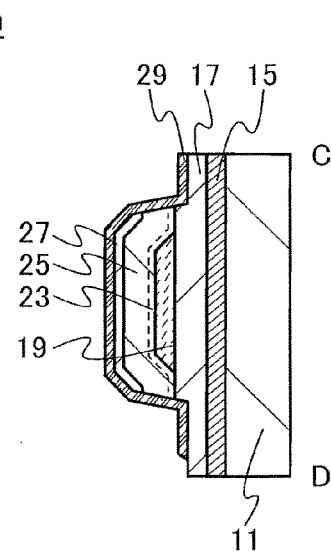
Figure 1B:
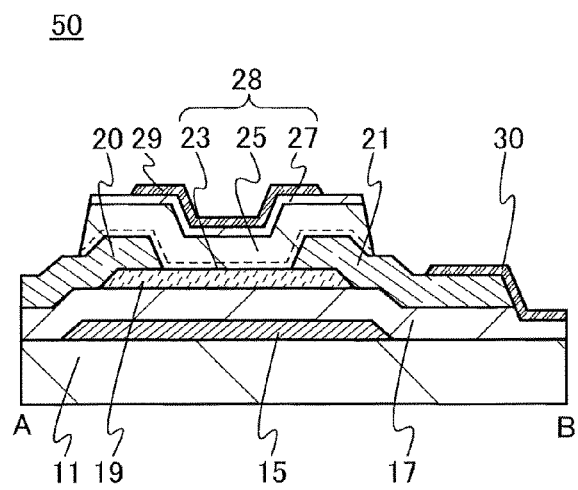

A top view and cross-sectional views of a transistor 50 included in a semiconductor device are illustrated in FIGS. 1A to 1C. The transistor 50 illustrated in FIGS. 1A to 1C is a channel-etched transistor. FIG. 1A is a top view of the transistor 50, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a gate insulating film 17, an oxide insulating film 23, an oxide insulating film 25, a nitride insulating film 27, and the like are omitted for simplicity.

The transistor 50 illustrated in FIGS. 1B and 1C includes a gate electrode 15 over the substrate 11; the gate insulating film 17 over the substrate 11 and the gate electrode 15; an oxide semiconductor film 19 overlapping with the gate electrode 15 with the gate insulating film 17 positioned therebetween; a pair of electrodes 20 and 21 in contact with the oxide semiconductor film 19; a gate insulating film 28 over the gate insulating film 17, the oxide semiconductor film 19, and the pair of electrodes 20 and 21; and a gate electrode 29 over the gate insulating film 28 and the gate insulating film 17. Further, the gate insulating film 28 includes the oxide insulating film 23, the oxide insulating film 25, and the nitride insulating film 27. Furthermore, an electrode 30 connected to one of the pair of electrodes 20 and 21 (here, the electrode 21) is formed over the gate insulating film 17. Note that the electrode 30 serves as a pixel electrode.

In the transistor 50 described in this embodiment, the oxide semiconductor film 19 is provided between the gate electrodes 15 and 29. The gate insulating film 28 that is isolated from a gate insulating film of an adjacent transistor overlaps with the oxide semiconductor film 19. Specifically, in the channel length direction in FIG. 1B, end portions of the gate insulating film 28 are positioned over the pair of electrodes 20 and 21, and in the channel width direction in FIG. 1C, end portions of the gate insulating film 28 are positioned on the outer side of the oxide semiconductor film 19. In the channel width direction in FIG. 1C, the gate electrode 29 faces a side surface of the oxide semiconductor film 19 with the gate insulating film 28 positioned therebetween. As illustrated in FIG. 1C, in the channel width direction, in the case where an interface between the oxide semiconductor film 19 and the gate insulating film 28 is referred to as a first interface and an interface between the gate insulating film 28 and the gate electrode 29 is referred to as a second interface, the minimum distance between the first interface and the second interface is preferably greater than or equal to 0.5 μm and less than or equal to 1.5 μm. In other words, the minimum distance between the side surface of the oxide semiconductor film 19 and the gate electrode 29 is preferably greater than or equal to 0.5 μm and less than or equal to 1.5 μm. In that case, a short circuit between the gate electrode 29 and the oxide semiconductor film 19 can be prevented, which can increase yield.

The oxide semiconductor film 19 is formed using typically an In—Ga oxide film, an In—Zn oxide film, an In-M-Zn oxide film (M represents Al, Ga, Y, Zr, La, Ce, or Nd), or the like.

Defects are formed at an end portion of the oxide semiconductor film processed by etching or the like because of damage due to the processing, and the end portion of the oxide semiconductor film is polluted by attachment of impurities, or the like. Thus, when stress such as an electric field is applied, the end portion of the oxide semiconductor film is easily activated to be n-type (have low resistance). Thus, in this embodiment, end portions of the oxide semiconductor film 19 that overlap with the gate electrode 15 are likely to be n-type. When the n-type end portions are formed between the pair of electrodes 20 and 21 as shown by dashed lines 19c and 19d of FIG. 1A, the n-type regions serve as carrier paths, resulting in formation of a parasitic channel. However, as illustrated in FIG. 1C, when the gate electrode 29 faces the side surface of the oxide semiconductor film 19 with the gate insulating film 28 positioned therebetween in the channel width direction, formation of a parasitic channel at the side surface of the oxide semiconductor film 19 and its vicinity is suppressed because of an electric field of the gate electrode 29. As a result, the transistor has excellent electrical characteristics in which drain current is drastically increased at the threshold voltage.

Further, an electric field from the outside can be blocked by the gate electrodes 15 and 29; thus, charges of charged particles and the like that are formed between the substrate 11 and the gate electrode 15 and over the gate electrode 29 do not affect the oxide semiconductor film 19. Therefore, degradation due to a stress test (e.g., a negative gate bias temperature (−GBT) stress test) can be reduced, and changes in the rising voltages of on-state current at different drain voltages can be suppressed. Note that this effect is caused when the gate electrodes 15 and 29 have the same potential or different potentials.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. As the amount of change in the threshold voltage between before and after the BT stress test is small, the transistor has higher reliability.

Next, a specific method of the BT stress test is described. First, initial characteristics of the transistor are measured. Next, the temperature of the substrate over which the transistor is formed (substrate temperature) is set at fixed temperature, the pair of electrodes serving as a source and a drain of the transistor are set at the same potential, and the gate electrode is supplied for a certain period with a potential different from that of the pair of electrodes serving as a source and a drain. The substrate temperature may be determined as appropriate in accordance with the test purpose. Then, the substrate temperature is set at a temperature similar to a temperature when the initial characteristics are measured, and electrical characteristics of the transistor are measured again. As a result, a difference between the threshold voltage in the initial characteristics and the threshold voltage in the electrical characteristics after the BT stress test can be obtained as the amount of change in the threshold voltage.

Note that the test in the case where the potential applied to the gate electrode is higher than the potential of the source and the drain is referred to as a positive GBT (+GBT) stress test, and the test in the case where the potential applied to the gate electrode is lower than the potential of the source and the drain is referred to as a negative GBT (−GBT) stress test. A BT stress test with light irradiation is referred to as a GBT photostress test. The test in the case where light irradiation is performed and the potential applied to the gate electrode is higher than the potential of the source and the drain is referred to as a positive GBT photostress test, and the test in the case where light irradiation is performed and the potential applied to the gate electrode is lower than the potential of the source and the drain is referred to as a negative GBT photostress test.

With the gate electrodes 15 and 29 having the same potential, the amount of change in the threshold voltage is reduced. Accordingly, variation in electrical characteristics among a plurality of transistors is also reduced. Further, in the oxide semiconductor film 19, a region in which carriers flow is increased in the film thickness direction; thus, the number of transferred carriers is increased. As a result, the on-state current of the transistor 50 is increased and the field-effect mobility is increased. Typically, the field-effect mobility is greater than or equal to 20 cm$^2$/Vs.

Further, the gate insulating film 28 over the oxide semiconductor film 19 includes an oxide insulating film containing a higher proportion of oxygen than that of oxygen in the stoichiometric composition. Part of oxygen is released by heating from the oxide insulating film containing a higher proportion of oxygen than that of oxygen in the stoichiometric composition. The oxide insulating film containing a higher proportion of oxygen than that of oxygen in the stoichiometric composition is an oxide insulating film of which the amount of released oxygen converted into oxygen atoms is greater than or equal to $1.0\times10^{18}$ atoms/cm$^3$, or greater than or equal to $3.0\times10^{20}$ atoms/cm$^3$ in TDS analysis.

In the case where the gate insulating film 28 includes the oxide insulating film containing a higher proportion of oxygen than that of oxygen in the stoichiometric composition, part of oxygen contained in the gate insulating film 28 can be transferred to the oxide semiconductor film 19 to reduce oxygen vacancies in the oxide semiconductor film 19.

In a transistor formed using an oxide semiconductor film including oxygen vacancies, the threshold voltage is likely to shift in the negative direction to have normally-on characteristics. This is because charges are generated owing to oxygen vacancies in the oxide semiconductor film and the resistance is thus reduced. The transistor having normally-on characteristics causes various problems in that malfunction is likely to be caused when in operation and that power consumption is increased when not in operation. Further, there is a problem in that the amount of change in electrical characteristics, typically in threshold voltage, of the transistor is increased by passage of time or a stress test.

However, in the transistor 50 described in this embodiment, the gate insulating film 28 over the oxide semiconductor film 19 includes an oxide insulating film containing a higher proportion of oxygen than that of oxygen in the stoichiometric composition. Thus, oxygen contained in the gate insulating film 28 can be transferred to the oxide semiconductor film 19 to reduce oxygen vacancies in the oxide semiconductor film 19. As a result, the transistor has normally-off characteristics. Further, the amount of change in electrical characteristics, typically in threshold voltage, of the transistor due to passage of time or a stress test can be reduced.

Other details of the transistor 50 are described below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 11. Furthermore, any of these substrates further provided with a semiconductor element may be used as the substrate 11. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 50 may be provided directly on the flexible substrate. Alternatively, a separation layer may be provided between the substrate 11 and the transistor 50. The separation layer can be used when part or the whole of a semiconductor device formed over the separation layer is separated from the substrate 11 and transferred onto another substrate. In that case, the transistor 50 can be transferred to a substrate having low heat resistance or a flexible substrate.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. The gate electrode 15 may have a single-layer structure or a layered structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

The gate insulating film 17 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The gate insulating film 17 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 17 is greater than or equal to 5 nm and less than or equal to 400 nm, greater than or equal to 10 nm and less than or equal to 300 nm, or greater than or equal to 50 nm and less than or equal to 250 nm.

The oxide semiconductor film 19 is typically an In—Ga oxide film, an In—Zn oxide film, or an In-M-Zn oxide film (M represents Al, Ga, Y, Zr, La, Ce, or Nd).

Note that in the case where the oxide semiconductor film 19 is an In-M-Zn oxide film, the proportions of In and M when summation of In and M is assumed to be 100 atomic % are as follows: the atomic percentage of In is greater than or equal to 25 atomic % and the atomic percentage of M is less than 75 atomic %; or the atomic percentage of In is greater than or equal to 34 atomic % and the atomic percentage of M is less than 66 atomic %.

The energy gap of the oxide semiconductor film 19 is 2 eV or more, 2.5 eV or more, or 3 eV or more. With the use of an oxide semiconductor having such a wide energy gap, the off-state current of the transistor 50 can be reduced.

The thickness of the oxide semiconductor film 19 is greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor film 19 is an In-M-Zn oxide film (M represents Al, Ga, Y, Zr, La, Ce, or Nd), it is preferable that the atomic ratio of metal elements of a sputtering target used for forming a film of the In-M-Zn oxide satisfy In≥M and Zn≥M As the atomic ratio of metal elements of such a sputtering target, In:M:Zn=1:1:1, In:M:Zn=1:1:2, and In:M:Zn=3:1:2 are preferable. Note that the atomic ratios of metal elements in the formed oxide semiconductor film 19 vary from those in the above-described sputtering target, within a range of ±40% as an error.

An oxide semiconductor film with low carrier density is used as the oxide semiconductor film 19. For example, an oxide semiconductor film whose carrier density is $1 \times 10^{17}/cm^3$ or lower, $1 \times 10^{15}/cm^3$ or lower, $1 \times 10^{13}/cm^3$ or lower, or $1 \times 10^{11}/cm^3$ or lower is used as the oxide semiconductor film 19.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 19 be set to be appropriate.

Note that it is preferable to use, as the oxide semiconductor film 19, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1 \times 10^6$ μm and a channel length of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor film 19. Specifically, the hydrogen concentration of the oxide semiconductor film 19, which is measured by secondary ion mass spectrometry (SIMS), is lower than or equal to $2 \times 10^{20}$ atoms/cm$^3$, lower than or equal to $5 \times 10^{19}$ atoms/cm$^3$, lower than or equal to $1 \times 10^{19}$ atoms/cm$^3$, lower than or equal to $5 \times 10^{18}$ atoms/cm$^3$, lower than or equal to $1 \times 10^{18}$ atoms/cm$^3$, lower than or equal to $5 \times 10^{17}$ atoms/cm$^3$, or lower than or equal to $1 \times 10^{16}$ atoms/cm$^3$.

When silicon or carbon that is one of elements belonging to Group 14 is contained in the oxide semiconductor film 19, oxygen vacancies are increased in the oxide semiconductor film 19, and the oxide semiconductor film 19 becomes an n-type film. Thus, the concentration of silicon or carbon (the concentration is measured by SIMS) of the oxide semiconductor film 19 is lower than or equal to $2 \times 10^{18}$ atoms/cm$^3$, or lower than or equal to $2 \times 10^{17}$ atoms/cm$^3$.

Further, the concentration of alkali metal or alkaline earth metal of the oxide semiconductor film 19, which is measured by SIMS, is lower than or equal to $1 \times 10^{18}$ atoms/cm$^3$, or lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 19.

Further, when containing nitrogen, the oxide semiconductor film 19 easily becomes n-type by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5 \times 10^{18}$ atoms/cm$^3$.

The oxide semiconductor film 19 may have a non-single-crystal structure, for example. The non-single crystal structure includes a c-axis aligned crystalline oxide semiconductor (CAAC-OS) that is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

The oxide semiconductor film 19 may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and has no crystal part.

Note that the oxide semiconductor film 19 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

The pair of electrodes 20 and 21 are formed with a single layer or a stack using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is formed over a copper-magnesium-aluminum alloy film, a two-layer structure in which a copper film is formed over a titanium film, a two-layer structure in which a copper film is formed over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 28 includes the oxide insulating film 23 in contact with the oxide semiconductor film 19, the oxide insulating film 25 in contact with the oxide insulating film 23, and the nitride insulating film 27 in contact with the oxide insulating film 25. The gate insulating film 28 preferably includes at least an oxide insulating film containing a higher proportion of oxygen than that of oxygen in the stoichiometric composition. Here, as the oxide insulating film 23, an oxide insulating film through which oxygen passes is formed. As the oxide insulating film 25, an oxide insulating film containing a higher proportion of oxygen than that of oxygen in the stoichiometric composition is formed. As the nitride insulating film 27, a nitride insulating film that blocks hydrogen and oxygen is formed.

The oxide insulating film 23 is an oxide insulating film through which oxygen passes. Thus, oxygen released from the oxide insulating film 25 over the oxide insulating film 23 can be transferred to the oxide semiconductor film 19 through the oxide insulating film 23. Further, the oxide insulating film 23 also serves as a film that relieves damage to the oxide semiconductor film 19 at the time of forming the oxide insulating film 25 later.

A silicon oxide film, a silicon oxynitride film, or the like with a thickness greater than or equal to 5 nm and less than or equal to 150 nm, or greater than or equal to 5 nm and less than or equal to 50 nm can be used as the oxide insulating film 23. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the number of defects in the oxide insulating film 23 be small and typically, the spin density of a signal that appears at g=2.001 due to a dangling bond of silicon be lower than or equal to $3 \times 10^{17}$ spins/cm$^3$ by electron spin resonance (ESR) measurement. This is because if the density of defects in the oxide insulating film 23 is high, oxygen is bonded to the defects and the amount of oxygen that passes through the oxide insulating film 23 is reduced.

Further, it is preferable that the number of defects at the interface between the oxide insulating film 23 and the oxide semiconductor film 19 be small and typically, the spin density of a signal that appears at g=1.93 due to an oxygen vacancy in the oxide semiconductor film 19 be lower than or equal to $1 \times 10^{17}$ spins/cm$^3$, more preferably lower than or equal to the lower limit of detection by ESR measurement.

Note that in the oxide insulating film 23, all oxygen that enters the oxide insulating film 23 from the outside is transferred to the outside of the oxide insulating film 23 in some cases. Alternatively, some oxygen that enters the oxide insulating film 23 from the outside remains in the oxide insulating film 23. Further, movement of oxygen occurs in the oxide insulating film 23 in some cases in such a manner that oxygen enters the oxide insulating film 23 from the outside and oxygen contained in the oxide insulating film 23 is transferred to the outside of the oxide insulating film 23.

The oxide insulating film 25 is formed in contact with the oxide insulating film 23. The oxide insulating film 25 is formed using an oxide insulating film that contains a higher proportion of oxygen than that of oxygen in the stoichiometric composition. Part of oxygen is released by heating from the oxide insulating film that contains a higher proportion of oxygen than that of oxygen in the stoichiometric composition. The oxide insulating film containing a higher proportion of oxygen than that of oxygen in the stoichiometric composition is an oxide insulating film of which the amount of released oxygen converted into oxygen atoms is greater than or equal to $1.0 \times 10^{18}$ atoms/cm$^3$, or greater than or equal to $3.0 \times 10^{20}$ atoms/cm$^3$ in TDS analysis.

A silicon oxide film, a silicon oxynitride film, or the like with a thickness greater than or equal to 30 nm and less than or equal to 500 nm, or greater than or equal to 50 nm and less than or equal to 400 nm can be used as the oxide insulating film 25.

Further, it is preferable that the number of defects in the oxide insulating film 25 be small and typically, the spin density of a signal that appears at g=2.001 originating from a dangling bond of silicon be lower than $1.5 \times 10^{18}$ spins/cm$^3$, more preferably lower than or equal to $1 \times 10^{18}$ spins/cm$^3$ by ESR measurement. Note that the oxide insulating film 25 is provided more apart from the oxide semiconductor film 19 than the oxide insulating film 23 is; thus, the oxide insulating film 25 may have higher defect density than the oxide insulating film 23.

The nitride insulating film 27 has an effect of blocking at least hydrogen and oxygen. Alternatively, the nitride insulating film 27 has an effect of blocking oxygen, hydrogen, water, an alkali metal, an alkaline earth metal, or the like.

The nitride insulating film 27 is formed using a silicon nitride film, a silicon nitride oxide film, an aluminum nitride film, an aluminum nitride oxide film, or the like having a thickness of greater than or equal to 50 nm and less than or equal to 300 nm, or greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

For each of the gate electrode 29 and the electrode 30, a light-transmitting conductive film is used. As examples of the light-transmitting conductive film, a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be given.

Next, a method for manufacturing the transistor 50 illustrated in FIGS. 1A to 1C is described with reference to FIGS. 2A to 2J. FIGS. 2A, 2C, 2E, 2G, and 2I are cross-sectional views in the channel length direction that illustrate steps for manufacturing the transistor 50 illustrated in FIG. 1B. FIGS. 2B, 2D, 2F, 2H, and 2J are cross-sectional views in the channel width direction that illustrate the steps for manufacturing the transistor 50 illustrated in FIG. 1C.

As illustrated in FIGS. 2A and 2B, the gate electrode 15 is formed over the substrate 11, and an insulating film 16 to be the gate insulating film 17 is formed over the gate electrode 15. Next, the oxide semiconductor film 19 is formed over the insulating film 16.

Here, a glass substrate is used as the substrate 11.

A method for forming the gate electrode 15 is described below. First, a conductive film is formed by a sputtering method, a CVD method, an evaporation method, or the like. Then, a mask is formed over the conductive film by a photolithography process using a first photomask. Next, part of the conductive film is etched with the use of the mask to form the gate electrode 15. After that, the mask is removed.

Note that the gate electrode 15 may be formed by an electrolytic plating method, a printing method, an inkjet method, or the like instead of the above formation method.

Here, a 100-nm-thick tungsten film is formed by a sputtering method. Next, a mask is formed by a photolithography process, and the tungsten film is subjected to dry etching with the use of the mask to form the gate electrode 15.

The insulating film 16 is formed by a sputtering method, a CVD method, an evaporation method, or the like.

In the case where a silicon oxide film, a silicon oxynitride film, or a silicon nitride oxide film is formed as the insulating film 16, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the insulating film 16, a metal organic chemical vapor deposition (MOCVD) method can be employed.

A formation method of the oxide semiconductor film 19 is described below. An oxide semiconductor film to be the oxide semiconductor film 19 is formed over the insulating film 16. Then, after a mask is formed over the oxide semiconductor film by a photolithography process using a second photomask, the oxide semiconductor film is partly etched using the mask. Thus, the oxide semiconductor film 19 subjected to element isolation as illustrated in FIGS. 2A and 2B is formed. After that, the mask is removed.

The oxide semiconductor film to be the oxide semiconductor film 19 can be formed by a sputtering method, a coating method, a pulsed laser deposition method, a laser ablation method, or the like.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Further, a target may be appropriately selected in accordance with the composition of the oxide semiconductor film to be formed.

In order to obtain an intrinsic or substantially intrinsic oxide semiconductor film, besides the high vacuum evacuation of the chamber, a highly purification of a sputtering gas is also needed. As an oxygen gas or an argon gas used for a sputtering gas, a gas that is highly purified to have a dew point of −40° C. or lower, −80° C. or lower, −100° C. or lower, or −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=3:1:2). Next, a mask is formed over the oxide semiconductor film, and part of the oxide semiconductor film is selectively etched. Thus, the oxide semiconductor film 19 is formed.

Next, as illustrated in FIGS. 2C and 2D, the pair of electrodes 20 and 21 are formed.

A method for forming the pair of electrodes 20 and 21 is described below. First, a conductive film is formed by a sputtering method, a CVD method, an evaporation method, or the like. Then, a mask is formed over the conductive film by a photolithography process using a third photomask. Next, the conductive film is etched with the use of the mask to form the pair of electrodes 20 and 21. After that, the mask is removed.

Here, a 50-nm-thick tungsten film and a 300-nm-thick copper film are formed in this order by a sputtering method. Then, a mask is formed over the copper film through a photolithography process. Next, the copper film is etched by a wet etching method using the mask. Subsequently, the tungsten film is etched by a dry etching method using $SF_6$, so that a fluoride is formed on a surface of the copper film. The fluoride can reduce diffusion of copper elements from the copper film, resulting in a reduction in the copper concentration in the oxide semiconductor film 19.

Next, as illustrated in FIGS. 2E and 2F, an oxide insulating film 22 to be the oxide insulating film 23 and an oxide insulating film 24 to be the oxide insulating film 25 are formed over the oxide semiconductor film 19 and the pair of electrodes 20 and 21.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating films 22 and 24 can be reduced and oxygen in the oxide insulating film 24 can be transferred to the oxide semiconductor film 19; accordingly, the number of oxygen vacancies in the oxide semiconductor film 19 can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, or greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film through which oxygen passes can be formed as the oxide insulating film 22. Further, by providing the oxide insulating film 22, damage to the oxide semiconductor film 19 can be reduced in a later step of forming the oxide insulating film 25.

As for the oxide insulating film 22, a silicon oxide film or a silicon oxynitride film can be formed as the oxide insulating film 22 under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong in the above substrate temperature range. Thus, as the oxide insulating film 22, a dense and hard oxide insulating film through which oxygen passes, typically, a silicon oxide film or a silicon oxynitride film of which etching using hydrofluoric acid of 0.5 wt % at 25° C. is performed at a rate of lower than or equal to 10 nm/min, or lower than or equal to 8 nm/min can be formed.

The oxide insulating film 22 is formed while heating is performed; thus, hydrogen, water, or the like contained in the oxide semiconductor film 19 can be released in the step. Hydrogen contained in the oxide semiconductor film 19 is bonded to an oxygen radical formed in plasma to form water. Since the substrate is heated in the step of forming the oxide insulating film 22, water formed by bonding of oxygen and hydrogen is released from the oxide semiconductor film. That is, when the oxide insulating film 22 is formed by a plasma CVD method, the amount of water and hydrogen contained in the oxide semiconductor film can be reduced.

Further, time for heating in a state where the oxide semiconductor film 19 is exposed can be shortened because heating is performed in a step of forming the oxide insulating film 22. Thus, the amount of oxygen released from the oxide semiconductor film by heat treatment can be reduced. That is, the number of oxygen vacancies in the oxide semiconductor film can be reduced.

Note that by setting the pressure in the treatment chamber to be greater than or equal to 100 Pa and less than or equal to 250 Pa, the amount of water contained in the oxide insulating film 23 is reduced; thus, variation in electrical characteristics of the transistor 50 can be reduced and change in threshold voltage can be inhibited.

Further, by setting the pressure in the treatment chamber to be greater than or equal to 100 Pa and less than or equal to 250 Pa, damage to the oxide semiconductor film 19 can be reduced when the oxide insulating film 22 is formed, so that the number of oxygen vacancies contained in the oxide semiconductor film 19 can be reduced. In particular, when the film formation temperature of the oxide insulating film 22 or the oxide insulating film 24 that is formed later is set to be high, typically higher than 220° C., part of oxygen contained in the oxide semiconductor film 19 is released and oxygen vacancies are easily formed. Further, when the film formation conditions for reducing the number of defects in the oxide insulating film 24 that is formed later are used to increase reliability of the transistor, the amount of released oxygen is easily reduced. Thus, it is difficult to reduce oxygen vacancies in the oxide semiconductor film 19 in some cases. However, by setting the pressure in the treatment chamber to be greater than or equal to 100 Pa and less than or equal to 250 Pa to reduce damage to the oxide semiconductor film 19 at the time of forming the oxide insulating film 22, oxygen vacancies in the oxide semiconductor film 19 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 22 can be reduced. Consequently, the amount of hydrogen entering the oxide semiconductor film 19 can be reduced; thus, the negative shift in the threshold voltage of the transistor can be inhibited.

Here, as the oxide insulating film 22, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film through which oxygen passes can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm² and less than or equal to 0.35 W/cm² is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to the treatment chamber having the above pressure, whereby the decomposition efficiency of the source gas in plasma is increased, oxygen radicals are increased, and oxidation of the source gas is promoted; therefore, the oxide insulating film 25 contains a higher proportion of oxygen than that of oxygen in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film that contains a higher proportion of oxygen than that of oxygen in the stoichiometric composition and from which part of oxygen is released by heating. Further, the oxide insulating film 22 is provided over the oxide semiconductor film 19. Accordingly, in the step of forming the oxide insulating film 24, the oxide insulating film 22 serves as a protective film of the oxide semiconductor film 19. Consequently, the oxide insulating film 24 can be formed using the high-frequency power having a high power density while damage to the oxide semiconductor film 19 is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm², and the power per unit area (power density) into which the supplied power is converted is 0.25 W/cm².

Next, heat treatment is performed. The heat treatment is performed typically at a temperature of higher than or equal to 150° C. and lower than or equal to 400° C., higher than or equal to 300° C. and lower than or equal to 400° C., or higher than or equal to 320° C. and lower than or equal to 370° C.

An electric furnace, a rapid thermal anneal (RTA) apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be transferred to the oxide semiconductor film 19, so that the number of oxygen vacancies contained in the oxide semiconductor film 19 can be reduced. Consequently, the number of oxygen vacancies in the oxide semiconductor film 19 can be further reduced.

Further, in the case where water, hydrogen, or the like is contained in the oxide insulating films 22 and 24, when the nitride insulating film 26 having a function of blocking water, hydrogen, and the like is formed later and heat treatment is performed, water, hydrogen, or the like contained in the oxide insulating films 22 and 24 are moved to the oxide semiconductor film 19, so that defects are generated in the oxide semiconductor film 19. However, by the heating, water, hydrogen, or the like contained in the oxide insulating films 22 and 24 can be released; thus, variation in electrical characteristics of the transistor 50 can be reduced, and change in threshold voltage can be inhibited.

Note that when the oxide insulating film 24 is formed over the oxide insulating film 22 while being heated, oxygen can be transferred to the oxide semiconductor film 19 to reduce the oxygen vacancies in the oxide semiconductor film 19; thus, the heat treatment is not necessarily performed.

Here, heat treatment is performed at 350° C. for one hour in an atmosphere of nitrogen and oxygen.

Further, when the pair of electrodes 20 and 21 are formed, the oxide semiconductor film 19 is damaged by the etching of the conductive film, so that oxygen vacancies are generated on the back channel side (the side of the oxide semiconductor film 19 that is opposite to the side facing to the gate electrode 15) of the oxide semiconductor film 19. However, with the use of the oxide insulating film containing a higher proportion of oxygen than that of oxygen in the stoichiometric composition as the oxide insulating film 24, the oxygen vacancies generated on the back channel side can be repaired by heat treatment. By this, defects contained in the oxide semiconductor film 19 can be reduced, and thus, the reliability of the transistor 50 can be improved.

Next, the nitride insulating film 26 is formed by a sputtering method, a CVD method, or the like.

Note that in the case where the nitride insulating film 26 is formed by a plasma CVD method, the substrate placed in the treatment chamber of the plasma CVD apparatus that is vacuum-evacuated is preferably set to be higher than or equal to 300° C. and lower than or equal to 400° C., or higher than or equal to 320° C. and lower than or equal to 370° C., so that a dense nitride insulating film can be formed.

In the case where a silicon nitride film is formed by the plasma CVD method as the nitride insulating film 26, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen that are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in a source gas, cleavage of a deposition gas containing silicon and cleavage of nitrogen are not promoted, so that a sparse silicon nitride film in which a bond between silicon and hydrogen remains and defects are increased is formed. Therefore, in a source gas, a flow ratio of the nitrogen to the ammonia is set to be greater than or equal to 5 and less than or equal to 50, or greater than or equal to 10 and less than or equal to 50.

Here, in the treatment chamber of a plasma CVD apparatus, a 50-nm-thick silicon nitride film is formed as the nitride insulating film 26 by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 $cm^2$, and the power per unit area (power density) into which the supplied power is converted is $1.7 \times 10^{-1}$ $W/cm^2$.

By the above-described steps, the oxide insulating film 22, the oxide insulating film 24, and the nitride insulating film 26 can be formed.

Next, heat treatment may be performed. The heat treatment is performed typically at a temperature of higher than or equal to 150° C. and lower than or equal to 400° C., higher than or equal to 300° C. and lower than or equal to 400° C., or higher than or equal to 320° C. and lower than or equal to 370° C.

Next, a mask is formed over the nitride insulating film 26 by a photolithography process using a fourth photomask, and then each of the oxide insulating film 22, the oxide insulating film 24, and the nitride insulating film 26 is partly etched using the mask, so that the gate insulating film 28 including the oxide insulating film 23, the oxide insulating film 25, and the nitride insulating film 27 is formed.

The oxide insulating film 22, the oxide insulating film 24, and the nitride insulating film 26 are each etched so that the end portions of the gate insulating film 28 are positioned over the pair of electrodes 20 and 21 in the channel length direction as illustrated in FIG. 2G and the end portions of the gate insulating film 28 are positioned on the outer side of the oxide semiconductor film 19 in the channel width direction as illustrated in FIG. 2H. As a result, the isolated gate insulating film 28 can be formed. In the case where part of the insulating film 16, at least a surface region, is formed using the same material as that of the oxide insulating film 23, the part of the insulating film 16 is also etched in the etching of the oxide insulating film 23. As a result, the gate insulating film 17 having a step is formed.

By the etching step, as illustrated in FIG. 2H, in the channel width direction, the minimum distance between the side surface of the oxide semiconductor film 19 and a side surface of the gate insulating film 28 preferably becomes greater than or equal to 0.5 µm and less than or equal to 1.5 µm. In that case, a short circuit between the gate electrode 29 and the oxide semiconductor film 19 can be prevented, which can increase yield.

Then, as illustrated in FIGS. 2I and 2J, the gate electrode 29 and the electrode 30 are formed. A method for forming the gate electrode 29 and the electrode 30 is described below. First, a conductive film is formed by a sputtering method, a CVD method, an evaporation method, or the like. Then, a mask is formed over the conductive film by a photolithography process using a fifth mask. Next, part of the conductive film is etched with the use of the mask to form the gate electrode 29 and the electrode 30. After that, the mask is removed.

As illustrated in FIG. 2I, the gate electrode 29 and the electrode 30 are formed so that end portions of the gate electrode 29 are positioned over the gate insulating film 28 in the channel length direction. Further, as illustrated in FIG. 2J, the gate electrode 29 and the electrode 30 are formed so that the gate electrode 29 faces the side surface of the oxide semiconductor film 19 with the gate insulating film 28 provided therebetween in the channel width direction, in other words, end portions of the gate electrode 29 are positioned on the outer side of the end portions of the oxide semiconductor film 19 in the channel width direction.

By the above-described process, the transistor 50 can be manufactured.

Figure 3A:
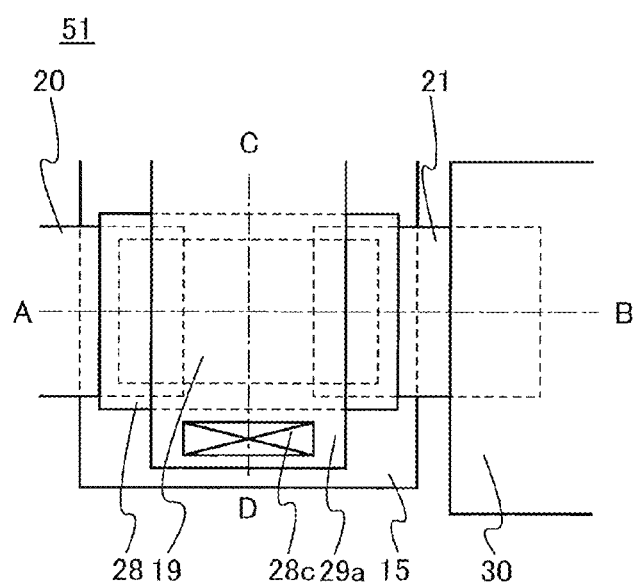
FIGS. 3A to 3C are a top view and cross-sectional views illustrating one embodiment of a transistor.
Figure 3C:
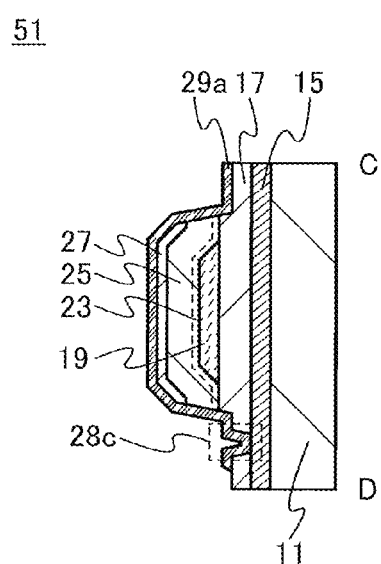
Figure 3B:
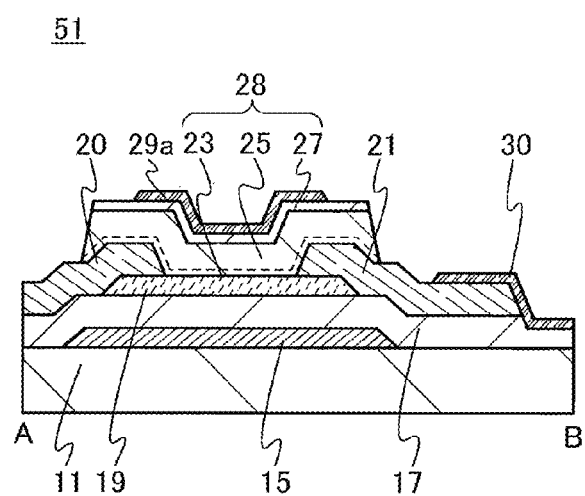

In FIGS. 2G and 2H, after the gate insulating film 28 is formed, a mask is formed by a photolithography process, and part of the gate insulating film 17 is etched, so that an opening 28c in which part of the gate electrode 15 is exposed is formed. Then, a gate electrode 29a may be formed so as to be connected to the gate electrode 15 in the opening 28c. Accordingly, a transistor 51 in which the gate electrodes 15 and 29a are connected to each other can be fabricated (see FIGS. 3A to 3C). That is, the gate electrodes 15 and 29a can have the same potential.

Figure 4A:
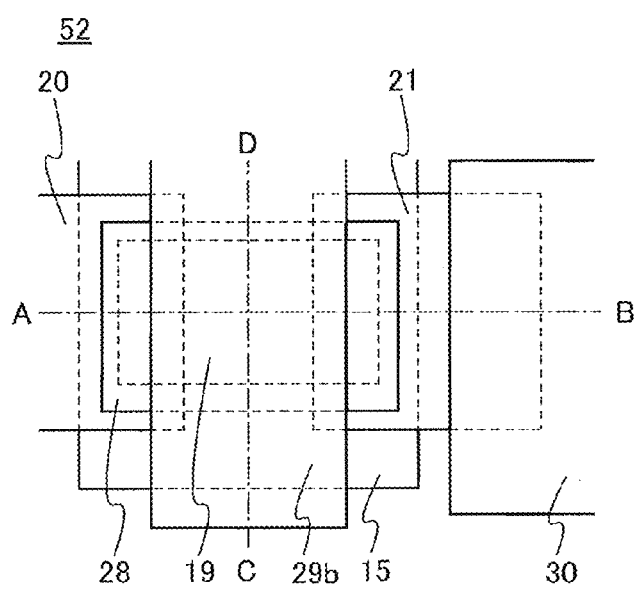
FIGS. 4A to 4C are a top view and cross-sectional views illustrating one embodiment of a transistor.
Figure 4C:
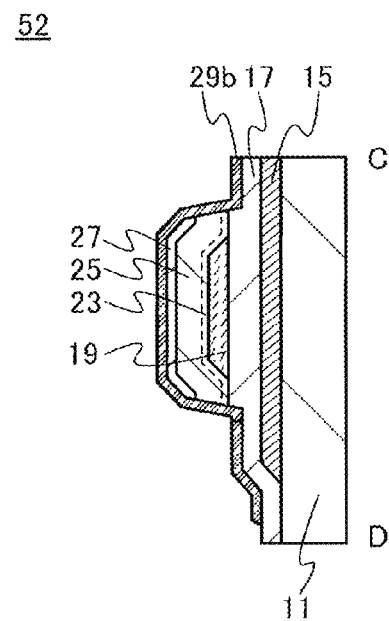
Figure 4B:
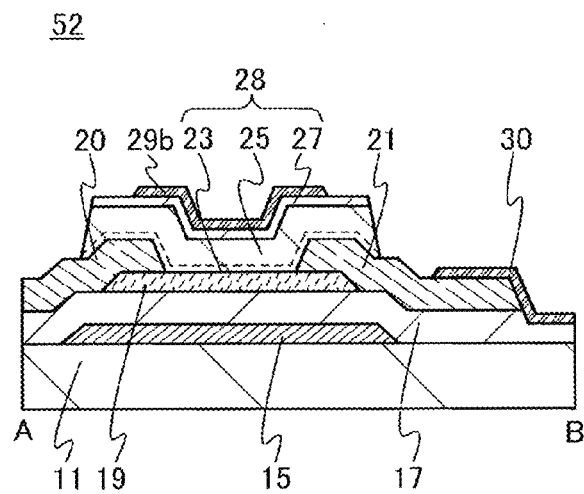

Furthermore, a shape of a transistor 52 in FIGS. 4A to 4C in which an end portion of a gate electrode 29b is positioned on the outer side of the gate electrode 15 in the channel width direction may be employed. Typically, as illustrated in FIG. 4C, in the channel width direction, the end portion of the gate electrode 29b is positioned on the outer side of the end portion of the gate electrode 15.

In the transistor described in this embodiment, when any of the gate electrodes 29, 29a, and 29b faces the side surface of the oxide semiconductor film 19 with the gate insulating film 28 positioned therebetween in the channel width direction, formation of a parasitic channel at the side surface of the oxide semiconductor film 19 and its vicinity is suppressed because of an electric field of any of the gate electrodes 29, 29a, and 29b. As a result, the transistor has excellent electrical characteristics in which drain current is drastically increased at the threshold voltage.

Further, the oxide insulating film containing a higher proportion of oxygen than that of oxygen in the stoichiometric composition is formed to overlap with the oxide semiconductor film that serves as a channel region, and thus, oxygen in the oxide insulating film can be transferred to the oxide semiconductor film. Consequently, the number of oxygen vacancies in the oxide semiconductor film can be reduced.

In this embodiment, an insulating film to be the gate insulating film 28 is formed by a plasma CVD method in which heating is performed at a temperature of higher than or equal to 280° C. and lower than or equal to 400° C. Thus, hydrogen, water, or the like contained in the oxide semiconductor film 19 can be released. Further, in the step, the length of heating time in a state where the oxide semiconductor film is exposed is short, and even when the temperature of the oxide semiconductor film with heat treatment is lower than or equal to 400° C., it is possible to manufacture a transistor in which the amount of change in threshold voltage is equivalent to that of a transistor subjected to heat treatment at a high temperature. Consequently, the manufacturing cost of a semiconductor device can be reduced.

Thus, a semiconductor device which includes an oxide semiconductor and in which formation of a parasitic channel due to a gate BT stress is suppressed can be provided. Further, a semiconductor device including an oxide semiconductor film and having improved electrical characteristics can be obtained.

Note that the structures, methods, and the like described in this embodiment can be used as appropriate in combination with any of the structures, methods, and the like described in the other embodiments.

Embodiment 2

In this embodiment, a semiconductor device and a manufacturing method thereof, which are different from those in Embodiment 1, are described with reference to drawings. This embodiment differs from Embodiment 1 in that a protective film is not isolated for each transistor.

Figure 5A:
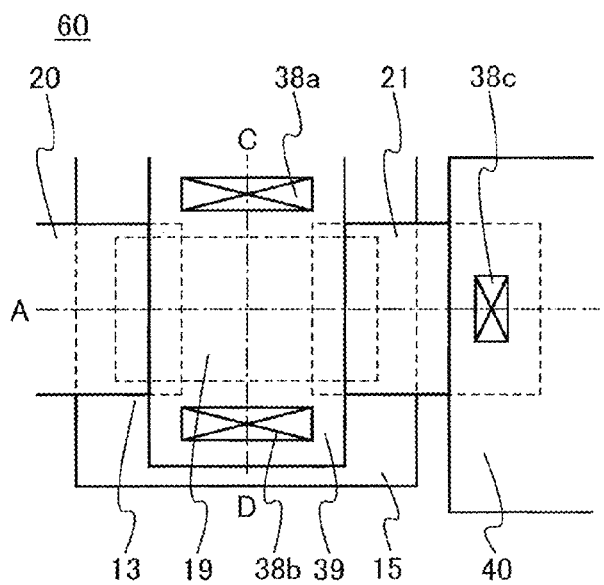
FIGS. 5A to 5C are a top view and cross-sectional views illustrating one embodiment of a transistor.
Figure 5C:
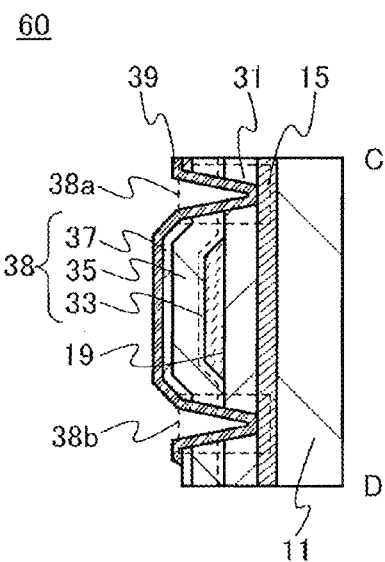
Figure 5B:
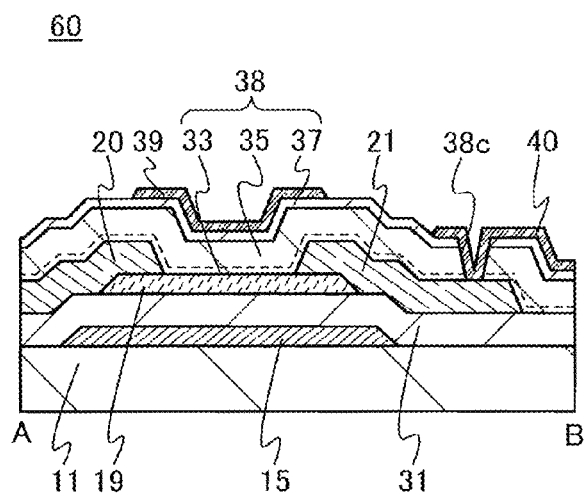

A top view and cross-sectional views of a transistor 60 included in a semiconductor device are illustrated in FIGS. 5A to 5C. The transistor 60 illustrated in FIGS. 5A to 5C is a channel-etched transistor. FIG. 5A is a top view of the transistor 60, FIG. 5B is a cross-sectional view taken along dashed-dotted line A-B of FIG. 5A, and FIG. 5C is a cross-sectional view taken along dashed-dotted line C-D of FIG. 5A. Note that in FIG. 5A, the substrate 11, a gate insulating film 31, an oxide insulating film 33, an oxide insulating film 35, a nitride insulating film 37 and the like are omitted for simplicity.

The transistor 60 illustrated in FIGS. 5B and 5C includes the gate electrode 15 over the substrate 11; the gate insulating film 31 over the substrate 11 and the gate electrode 15; the oxide semiconductor film 19 overlapping with the gate electrode 15 with the gate insulating film 31 positioned therebetween; the pair of electrodes 20 and 21 in contact with the oxide semiconductor film 19; a gate insulating film 38 over the gate insulating film 31, the oxide semiconductor film 19, and the pair of electrodes 20 and 21; and a gate electrode 39 over the gate insulating film 38. Further, the gate insulating film 38 includes the oxide insulating film 33, the oxide insulating film 35, and the nitride insulating film 37. Furthermore, an electrode 40 connected to one of the pair of electrodes 20 and 21 (here, the electrode 21) is formed over the nitride insulating film 37. Note that the electrode 40 serves as a pixel electrode.

In the transistor 60 described in this embodiment, the oxide semiconductor film 19 is provided between the gate electrodes 15 and 39. The gate insulating film 38 includes a plurality of openings. Typically, the gate insulating film 38 includes openings 38a and 38b between which the oxide semiconductor film 19 is positioned in the channel width direction. The openings 38a and 38b are formed also in the gate insulating film 31. The gate insulating film 38 includes an opening 38c in which one of the pair of electrodes 20 and 21 is exposed. In the channel width direction in FIG. 5C, the gate electrode 39 is formed over the gate insulating film 38 and in the openings 38a and 38b formed in the gate insulating films 31 and 38. In the openings 38a and 38b, the gate electrode 15 is connected to the gate electrode 39. The gate electrode 39 faces side surfaces of the oxide semiconductor film 19 at side surfaces of the openings 38a and 38b. Note that as illustrated in FIG. 5C, in the channel width direction, the minimum distance between the side surface of the oxide semiconductor film 19 and each of the side surfaces of the openings 38a and 38b is preferably greater than or equal to 0.5 μm and less than or equal to 1.5 μm. Typically, the distance between the side surface of the oxide semiconductor film 19 and each of the side surfaces of the openings 38a and 38b that is the closest to the side surface of the oxide semiconductor film 19 is preferably greater than or equal to 0.5 μm and less than or equal to 1.5 μm. In other words, the minimum distance between the side surface of the oxide semiconductor film 19 and the gate electrode 39 is preferably greater than or equal to 0.5 μm and less than or equal to 1.5 μm. In that case, a short circuit between the gate electrode 39 and the oxide semiconductor film 19 can be prevented, which can increase yield.

Defects are formed at an end portion of the oxide semiconductor film processed by etching or the like because of damage due to processing, and the end portion of the oxide semiconductor film is polluted by attachment of impurities, or the like. Thus, when stress such as an electric field is applied, the end portion of the oxide semiconductor film is easily activated to be n-type (have low resistance). Thus, in this embodiment, an end portion of the oxide semiconductor film 19 that overlaps with the gate electrode 15 is likely to be n-type. When the n-type end portion is formed between the pair of electrodes 20 and 21, the n-type region serves as a carrier path, resulting in formation of a parasitic channel. However, as illustrated in FIG. 5C, when the gate electrode 39 faces the side surface of the oxide semiconductor film 19 with the gate insulating film 38 positioned therebetween in the channel width direction, formation of a parasitic channel at the side surface of the oxide semiconductor film 19 and its vicinity is suppressed because of an electric field of the gate electrode 39. As a result, the transistor has excellent electrical characteristics in which drain current is drastically increased at the threshold voltage.

Further, an electric field from the outside can be blocked by the gate electrodes 15 and 39 that are connected to each other; thus, charges of charged particles and the like that are formed between the substrate 11 and the gate electrode 15 and over the gate electrode 39 do not affect the oxide semiconductor film 19. Therefore, degradation due to a stress test (e.g., −GBT stress test) can be reduced, and changes in the rising voltages of on-state current at different drain voltages can be reduced.

With the gate electrodes 15 and 39 that are connected to each other, the amount of change in the threshold voltage is reduced. Accordingly, variation in electrical characteristics among a plurality of transistors is also reduced.

Moreover, the gate insulating film 38 over the oxide semiconductor film 19 includes an oxide insulating film containing a higher proportion of oxygen than that of oxygen in the stoichiometric composition. Part of oxygen is released by heating from the oxide insulating film containing a higher proportion of oxygen than that of oxygen in the stoichiometric composition. The oxide insulating film containing a higher proportion of oxygen than that of oxygen in the stoichiometric composition is an oxide insulating film of which the amount of released oxygen converted into oxygen atoms is greater than or equal to $1.0 \times 10^{18}$ atoms/cm$^3$, or greater than or equal to $3.0 \times 10^{20}$ atoms/cm$^3$ in TDS analysis.

In the case where the gate insulating film 38 includes the oxide insulating film containing a higher proportion of oxygen than that of oxygen in the stoichiometric composition, part of oxygen contained in the gate insulating film 38 can be transferred to the oxide semiconductor film 19 to reduce oxygen vacancies in the oxide semiconductor film 19. Consequently, the number of oxygen vacancies in the oxide semiconductor film 19 can be further reduced.

In a transistor formed using an oxide semiconductor film including oxygen vacancies, the threshold voltage is likely to shift in the negative direction to have normally-on characteristics. This is because charges are generated owing to oxygen vacancies in the oxide semiconductor film and the resistance is thus reduced. The transistor having normally-on characteristics causes various problems in that malfunction is likely to be caused when in operation and that power consumption is increased when not in operation. Further, there is a problem in that the amount of change in electrical characteristics, typically in threshold voltage, of the transistor is increased by passage of time or a stress test.

However, in the transistor 60 described in this embodiment, the gate insulating film 38 over the oxide semiconductor film 19 includes an oxide insulating film containing a higher proportion of oxygen than that of oxygen in the stoichiometric composition. Accordingly, the number of oxygen vacancies in the oxide semiconductor film 19 can be reduced, and thus the transistor has normally-off characteristics. Further, the amount of change in electrical characteristics, typically in threshold voltage, of the transistor due to passage of time or a stress test can be reduced.

Other details of the transistor 60 are described below. Descriptions of the structures having the same reference numerals as those of Embodiment 1 are omitted.

The gate insulating film 31 can be formed using a material similar to that of the gate insulating film 17 described in Embodiment 1 as appropriate.

The gate insulating film 38 includes the oxide insulating film 33 in contact with the oxide semiconductor film 19, the oxide insulating film 35 in contact with the oxide insulating film 33, and the nitride insulating film 37 in contact with the oxide insulating film 35. Note that the oxide insulating film 33 can be formed using a material similar to that of the oxide insulating film 23 described in Embodiment 1 as appropriate. The oxide insulating film 35 can be formed using a material similar to that of the oxide insulating film 25 described in Embodiment 1 as appropriate. The nitride insulating film 37 can be formed using a material similar to that of the nitride insulating film 27 described in Embodiment 1 as appropriate.

The gate electrode 39 and the electrode 40 can be formed using a material similar to that of the gate electrode 29 and the electrode 30 described in Embodiment 1 as appropriate.

Figure 6A:
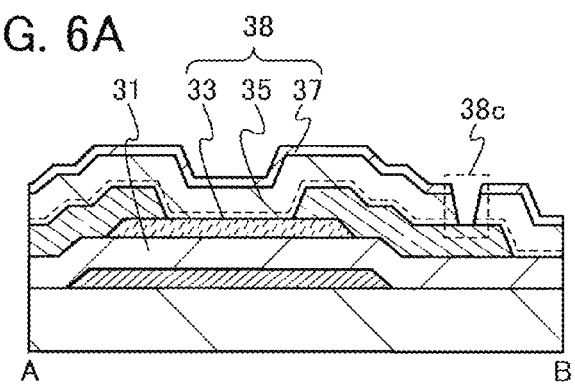
FIGS. 6A to 6D are cross-sectional views illustrating one embodiment of a method for manufacturing a transistor.
Figure 6B:
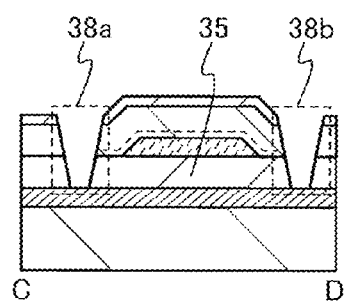
Figure 6C:
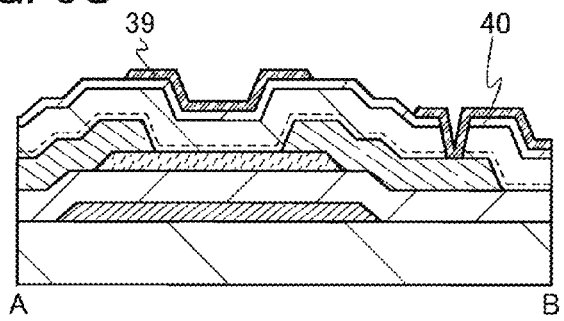
Figure 6D:
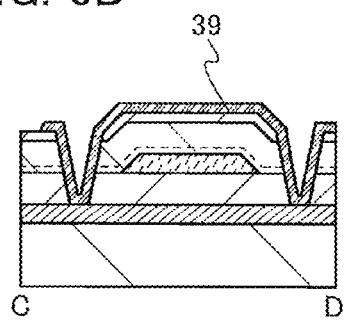

Next, a method for manufacturing the transistor 60 illustrated in FIGS. 5A to 5C is described with reference to FIGS. 2A to 2F and FIGS. 6A to 6D. FIGS. 6A and 6C are cross-sectional views in the channel length direction that illustrate steps for manufacturing the transistor 60 illustrated in FIG. 5B. FIGS. 6B and 6D are cross-sectional views in the channel width direction that illustrate the steps for manufacturing the transistor 60 illustrated in FIG. 5C.

As in the case of Embodiment 1, through steps of FIGS. 2A to 2F, the gate electrode 15, the insulating film 16, the oxide semiconductor film 19, the pair of electrodes 20 and 21, the oxide insulating film 22, the oxide insulating film 24, and the nitride insulating film 26 are formed over the substrate 11. In the steps, a photolithography process is performed using the first to third photomasks.

Next, a mask is formed over the nitride insulating film 26 by a photolithography process using the fourth photomask, and then each of the oxide insulating film 22, the oxide insulating film 24, and the nitride insulating film 26 is partly etched using the mask, so that the gate insulating film 38 including the oxide insulating film 33, the oxide insulating film 35, and the nitride insulating film 37 is formed.

In the step, as illustrated in FIG. 6A, each of the oxide insulating film 33, the oxide insulating film 35, and the nitride insulating film 37 is partly etched to form the opening 38c in which the electrode 21, which is one of the pair of electrodes 20 and 21, is exposed in the channel length direction. Further, as illustrated in FIG. 6B, the openings 38a and 38b are formed so that the oxide semiconductor film 19 is positioned therebetween in the channel width direction. In the channel width direction, the minimum distance between the side surface of the oxide semiconductor film 19 and each of the side surfaces of the openings 38a and 38b is preferably greater than or equal to 0.5 µm and less than or equal to 1.5 µm. In that case, a short circuit between the gate electrode 39 and the oxide semiconductor film 19 can be prevented, which can increase yield. Further, the gate insulating film 38 including the openings 38a, 38b, and 38c can be formed.

Then, as illustrated in FIGS. 6C and 6D, the gate electrode 39 and the electrode 40 are formed. A method for forming the gate electrode 39 and the electrode 40 is described below. First, a conductive film is formed by a sputtering method, a CVD method, an evaporation method, or the like. Then, a mask is formed over the conductive film by a photolithography process using the fifth mask. Next, part of the conductive film is etched with the use of the mask to form the gate electrode 39 and the electrode 40. After that, the mask is removed.

As illustrated in FIG. 6D, in the channel width direction, the gate electrode 39 and the electrode 40 are formed so that the gate electrode 39 faces the side surface of the oxide semiconductor film 19 at each of the side surface of the openings 38a and 38b, in other words, end portions of the gate electrode 39 are positioned on the outer side of the end portions of the oxide semiconductor film 19.

Through the above-described process, the transistor 60 can be manufactured.

In the transistor described in this embodiment, when the gate electrode 39 faces the side surface of the oxide semiconductor film 19 at each of the side surfaces of the openings 38a and 38b formed in the gate insulating film 38 in the channel width direction, formation of a parasitic channel at the side surface of the oxide semiconductor film 19 and its vicinity is suppressed because of an electric field of the gate electrode 39. As a result, the transistor has excellent electrical characteristics in which drain current is drastically increased at the threshold voltage.

Further, the oxide insulating film containing a higher proportion of oxygen than that of oxygen in the stoichiometric composition is formed to overlap with the oxide semiconductor film that serves as a channel region, and thus, oxygen in the oxide insulating film can be transferred to the oxide semiconductor film. Consequently, the number of oxygen vacancies in the oxide semiconductor film can be reduced.

In this embodiment, an insulating film to be the gate insulating film 28 is formed by a plasma CVD method in which heating is performed at a temperature of higher than or equal to 280° C. and lower than or equal to 400° C. Thus, hydrogen, water, or the like contained in the oxide semiconductor film 19 can be released. Further, in the step, the length of heating time in a state where the oxide semiconductor film is exposed is short, and even when the temperature of the oxide semiconductor film with heat treatment is lower than or equal to 400° C., it is possible to manufacture a transistor in which the amount of change in threshold voltage is equivalent to that of a transistor subjected to heat treatment at a high temperature. Consequently, the manufacturing cost of a semiconductor device can be reduced.

Thus, a semiconductor device which includes an oxide semiconductor and in which formation of a parasitic channel due to a gate BT stress is suppressed can be provided. Further, a semiconductor device including an oxide semiconductor film and having improved electrical characteristics can be obtained.

Note that the structures, methods, and the like described in this embodiment can be used as appropriate in combination with any of the structures, methods, and the like described in the other embodiments.

Embodiment 3

In this embodiment, the electrical characteristics of the transistor having a dual-gate structure described in Embodiments 1 and 2 that includes gate electrodes connected to each other and having the same potential are described with reference to FIGS. 1A to 1C and FIG. 7A to FIG. 12C.

Note that here a driving method in which the gate electrodes 15 and 29 in FIG. 1A are electrically short-circuited and are supplied with a gate voltage is referred to as dual-gate driving. In other words, in dual-gate driving, the voltage of the gate electrode 15 is always equal to that of the gate electrode 29.

Figure 7A:
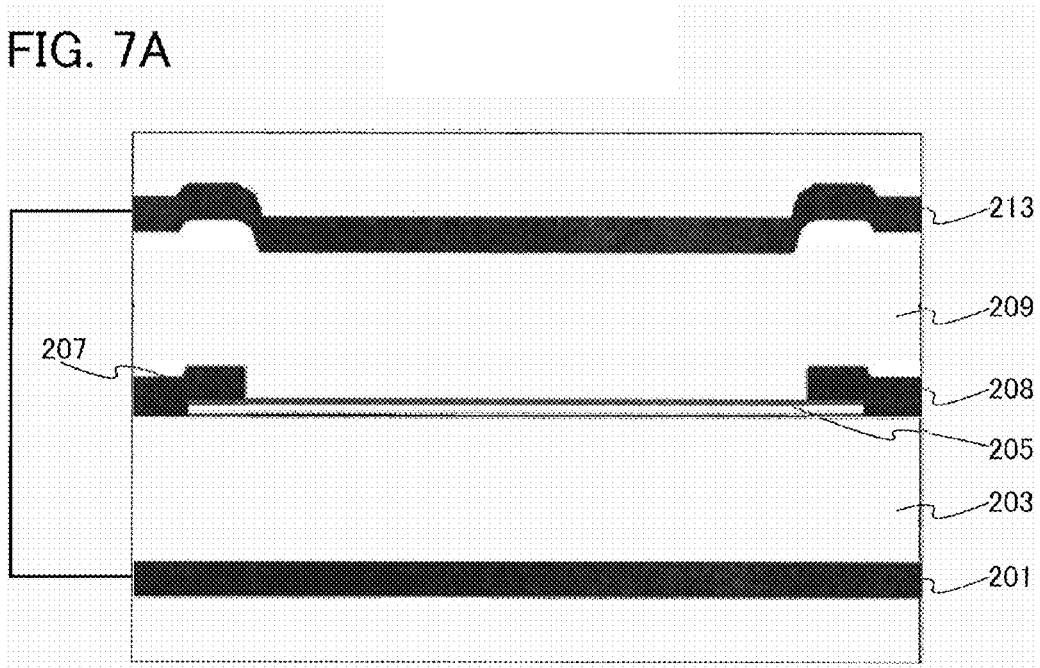
FIGS. 7A and 7B are cross-sectional views illustrating structures of transistors.
Figure 7B:
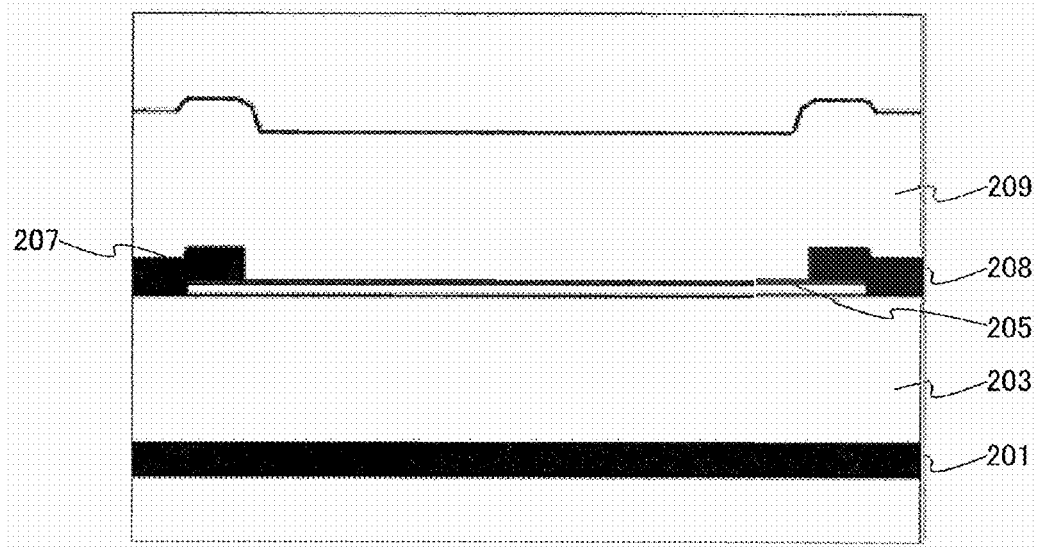

Here, the electrical characteristics of the transistor were evaluated. FIGS. 7A and 7B illustrate the structures of transistors used for the calculation. Note that device simulation software "Atlas" produced by Silvaco Inc. was used for the calculation.

A transistor having Structure 1 in FIG. 7A is a dual-gate transistor.

In the transistor having Structure 1, an insulating film 203 is formed over a gate electrode 201, and an oxide semiconductor film 205 is formed over the insulating film 203. A pair of electrodes 207 and 208 are formed over the insulating film 203 and the oxide semiconductor film 205, and an insulating film 209 is formed over the oxide semiconductor film 205 and the pair of electrodes 207 and 208. A gate electrode 213 is formed over the insulating film 209. The gate electrode 201 is connected to the gate electrode 213 at an opening (not illustrated) formed in the insulating films 203 and 209.

A transistor having Structure 2 in FIG. 7B is a single-gate transistor.

In the transistor having Structure 2, the insulating film 203 is formed over the gate electrode 201, and the oxide semiconductor film 205 is formed over the insulating film 203. The pair of electrodes 207 and 208 are formed over the insulating film 203 and the oxide semiconductor film 205, and the insulating film 209 is formed over the oxide semiconductor film 205 and the pair of electrodes 207 and 208.

Note that in the calculation, the work function $\phi_m$ of the gate electrode 201 was set to 5.0 eV. The insulating film 203 was a 100-nm-thick film having a dielectric constant of 4.1. The oxide semiconductor film 205 was a single-layer In—Ga—Zn oxide film (In:Ga:Zn=1:1:1). The band gap $E_g$ of the In—Ga—Zn oxide film was 3.15 eV, the electron affinity $\chi$ was 4.6 eV, the dielectric constant was 15, the electron mobility was 10 cm$^2$/Vs, and the donor density $N_d$ was $3 \times 10^{17}$ atoms/cm$^3$. The work function $\phi_{sd}$ of the pair of electrodes 207 and 208 was set to 4.6 eV. Ohmic junction was made between the oxide semiconductor film 205 and each of the pair of electrodes 207 and 208. The insulating film 209 was a 100-nm-thick film having a dielectric constant of 4.1. Note that defect levels, surface scattering, and the like in the oxide semiconductor film 205 were not considered. Further, the channel length and the channel width of the transistor were 10 μm and 100 μm, respectively.

<Reduction in Variation in Initial Characteristics>

As in the case of the transistor having Structure 1, by the dual-gate driving, variation in initial characteristics can be reduced. This is because on account of the dual-gate driving, the amount of change in the threshold voltage $V_{th}$, which is one of Id-Vg characteristics, of the transistor having Structure 1 can be small as compared to that of the transistor having Structure 2.

Here, as one example, a negative shift in the threshold voltage of the Id-Vg characteristics that is caused because a semiconductor film becomes n-type is described.

The sum of the amount of charges of donor ions in the oxide semiconductor film is Q (C), the capacitance formed by the gate electrode 201, the insulating film 203, and the oxide semiconductor film 205 is $C_{Bottom}$, and the capacitance formed by the oxide semiconductor film 205, the insulating film 209, and the gate electrode 213 is $C_{Top}$. The amount of change ΔV of the threshold voltage $V_{th}$ of the transistor having Structure 1 in that case is expressed by Formula 1. The amount of change ΔV of the threshold voltage $V_{th}$ of the transistor having Structure 2 in that case is expressed by Formula 2.

$$\Delta V = -\frac{Q}{C_{Bottom} + C_{Top}} \quad \text{[Formula 1]}$$

$$\Delta V = -\frac{Q}{C_{Bottom}} \quad \text{[Formula 2]}$$

As expressed by Formula 1, by the dual-gate driving performed in the transistor having Structure 1, the capacitance between donor ions in the oxide semiconductor film and the gate electrode becomes the sum of $C_{Bottom}$ and $C_{Top}$; thus, the amount of change in the threshold voltage is small.

Figure 8A:
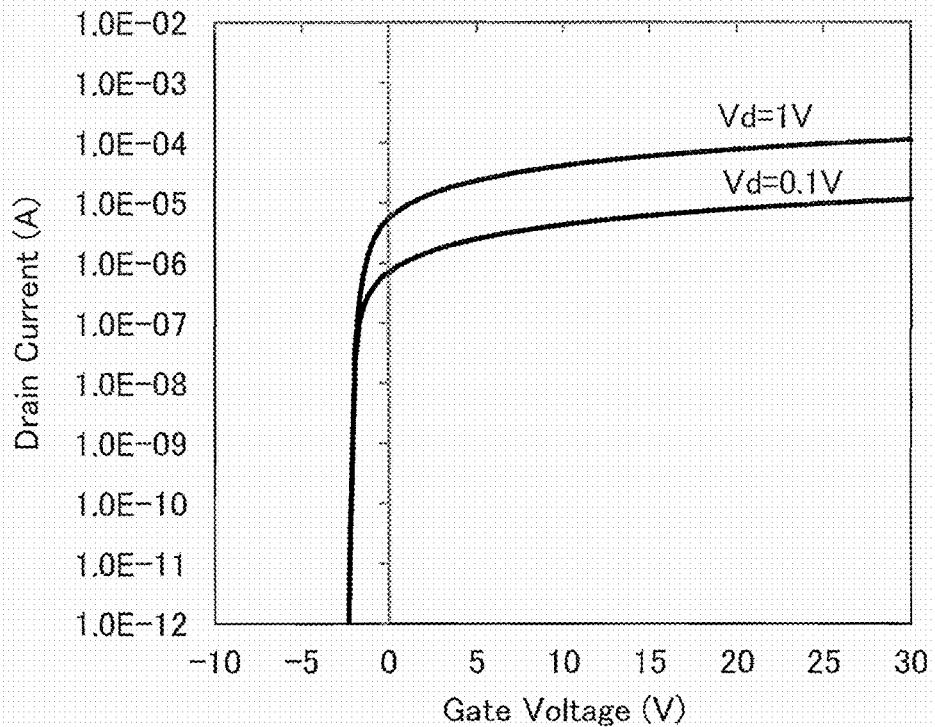
FIGS. 8A and 8B are graphs each showing current-voltage curves obtained by calculation.
Figure 8B:
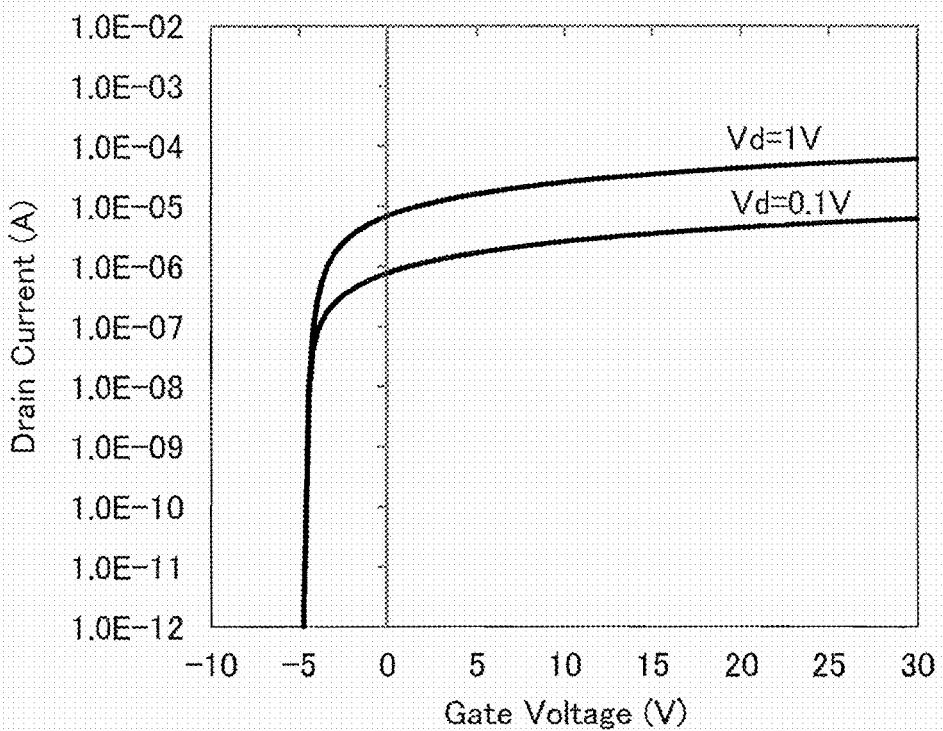

FIG. 8A shows the calculation results of the current-voltage curves at drain voltages of 0.1 V and 1 V of the transistor having Structure 1. FIG. 8B shows the calculation results of the current-voltage curves at drain voltages of 0.1 V and 1 V of the transistor having Structure 2. When the drain voltage Vd is 0.1 V, the threshold voltage of the transistor having Structure 1 is −2.26 V and the threshold voltage of the transistor having Structure 2 is −4.73 V.

As in the case of the transistor having Structure 1, when the dual-gate driving is employed, the amount of change in the threshold voltage can be small. Thus, variation in electrical characteristics among a plurality of transistors can also be small.

Note that although a negative shift in the threshold voltage due to the donor ions in the oxide semiconductor film is considered here, a positive shift in the threshold voltage due to fixed charges, mobile charges, or negative charges (electrons trapped by acceptor-like states) in the insulating films 203 and 209 is similarly suppressed, which might reduce the variation.

<Reduction in Degradation Due to −GBT Stress Test>

By the dual-gate driving performed in the transistor having Structure 1, degree of degradation due to a −GBT stress test can be low. Some reasons why the degree of degradation due to the −GBT stress test can be low are described below.

Figure 9A:
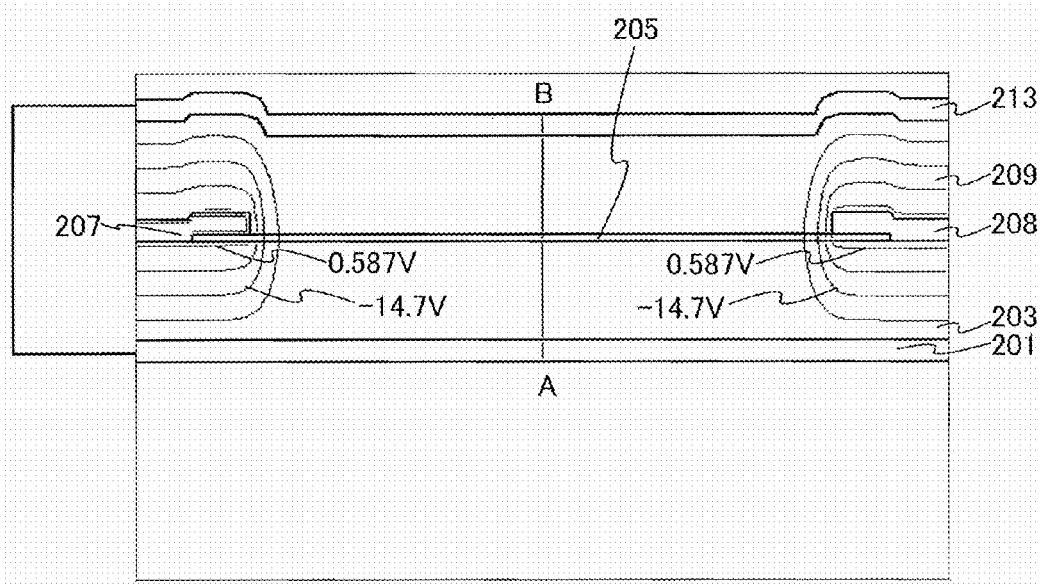
FIGS. 9A and 9B are diagrams showing the calculation results of potentials of a transistor.
Figure 9B:
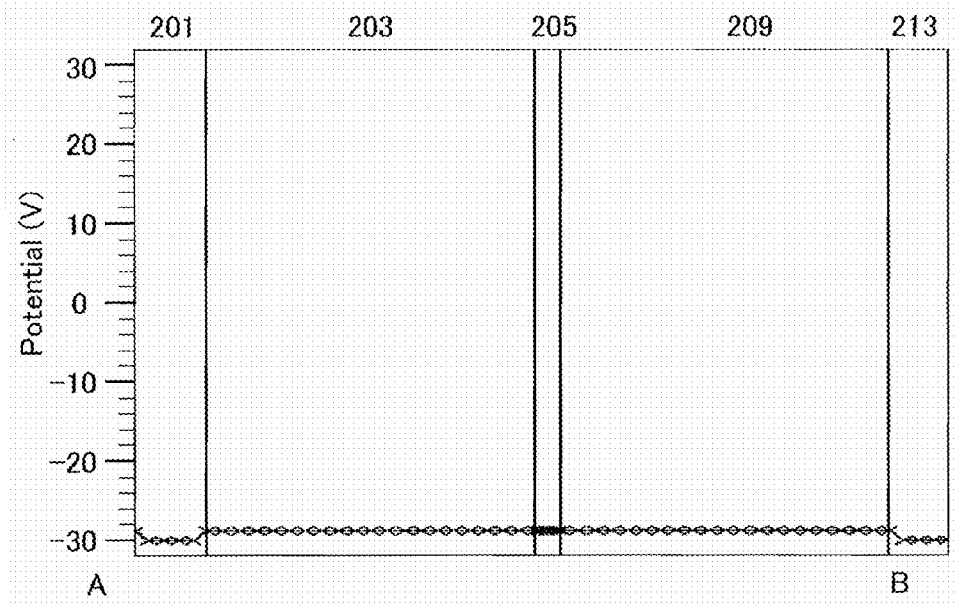

One of the reasons is that electrostatic stress is not caused on account of the dual-gate driving. FIG. 9A is a diagram in which potential contour lines are plotted in the case where −30 V is applied to each of the gate electrodes 201 and 213 in the transistor having Structure 1. FIG. 9B shows potentials at the cross section A-B in FIG. 9A.

The oxide semiconductor film 205 is an intrinsic semiconductor, and when a negative voltage is applied to the gate electrodes 201 and 213 and the oxide semiconductor film 205 is fully depleted, no charge exists between the gate electrodes 201 and 213. With this state, when the same potential is supplied to the gate electrodes 201 and 213, as illustrated in FIG. 9B, the potential of the gate electrode 201 becomes completely equal to that of the gate electrode 213. Since the potentials are equal to each other, electrostatic stress is not caused on the insulating film 203, the oxide semiconductor film 205, and the insulating film 209. As a result, phenomena causing degradation due to the −GBT stress test, such as mobile ions and trap and detrap of carriers in the insulating films 203 and 209, do not occur.

Figure 10A:
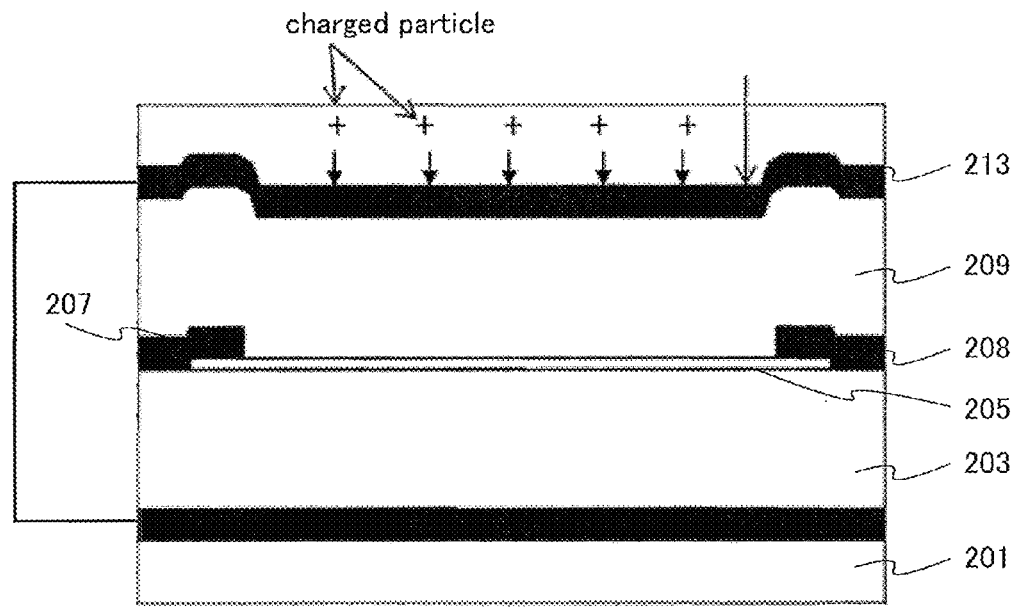
FIGS. 10A and 10B are diagrams illustrating models.
Figure 10B:
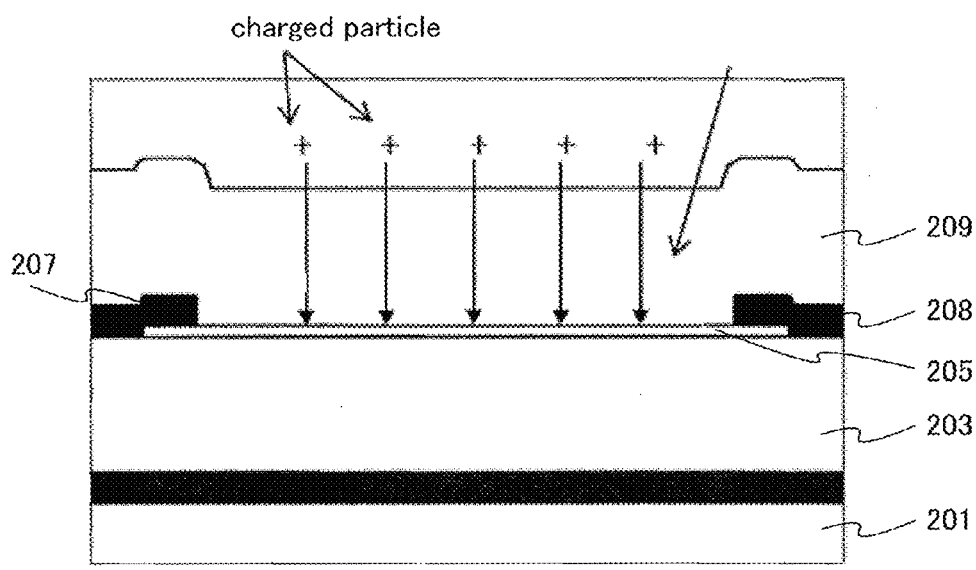

Another reason is that an external electric field of an FET can be blocked in the case of the dual-gate driving. FIG. 10A illustrates a model in which charged particles in the air are adsorbed on the gate electrode 213 in the transistor having Structure 1 illustrated in FIG. 7A. FIG. 10B illustrates a model in which charged particles in the air are adsorbed on the insulating film 209 in the transistor having Structure 2 illustrated in FIG. 7B.

As illustrated in FIG. 10B, in the transistor having Structure 2, positively charged particles in the air are adsorbed on a surface of the insulating film 209. When a negative voltage is applied to the gate electrode 201, positively charged particles are adsorbed on the insulating film 209. As a result, as indicated by arrows in FIG. 10B, an electric field of the positively charged particles reaches the interface of the oxide semiconductor film 205 with the insulating film 209, so that a state similar to the state when a positive bias is applied is brought about. As a result, the threshold voltage might shift in the negative direction.

In contrast, even if positively charged particles are adsorbed on a surface of the gate electrode 213 in the transistor having Structure 1 illustrated in FIG. 10A, as indicated by arrows in FIG. 10A, the gate electrode 213 blocks the electric field of the positively charged particles; thus, the positively charged particles do not affect the electrical characteristics of the transistor. In sum, the transistor can be electrically protected against external charges by the gate electrode 213, leading to suppression of the degradation due to the −GBT stress test.

For the above two reasons, in the transistor operated by the dual-gate driving, the degradation due to the −GBT stress test can be suppressed.

<Suppression of Changes in Rising Voltages of on-State Current at Different Drain Voltages>

Here, in the case of Structure 2, changes in the rising voltages of on-state current at different drain voltages and a cause of the changes are described.

Figure 11A:
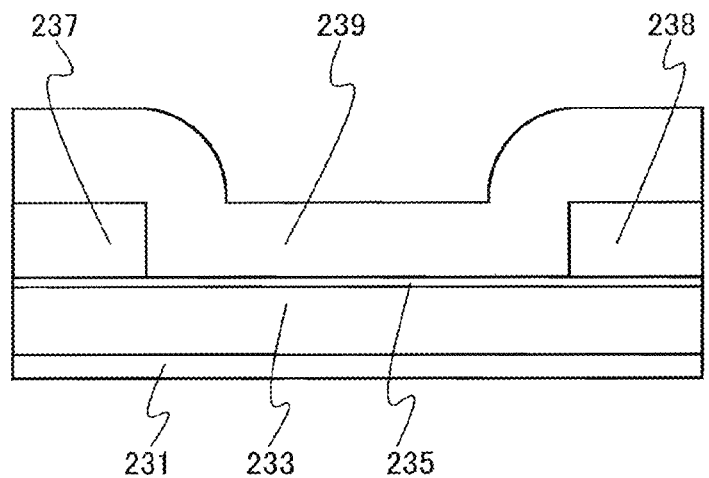
FIGS. 11A to 11C are diagrams illustrating models.
Figure 11B:
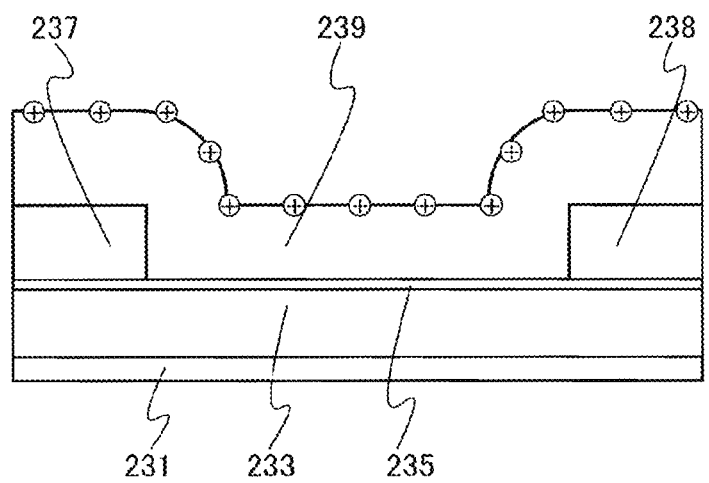
Figure 11C:
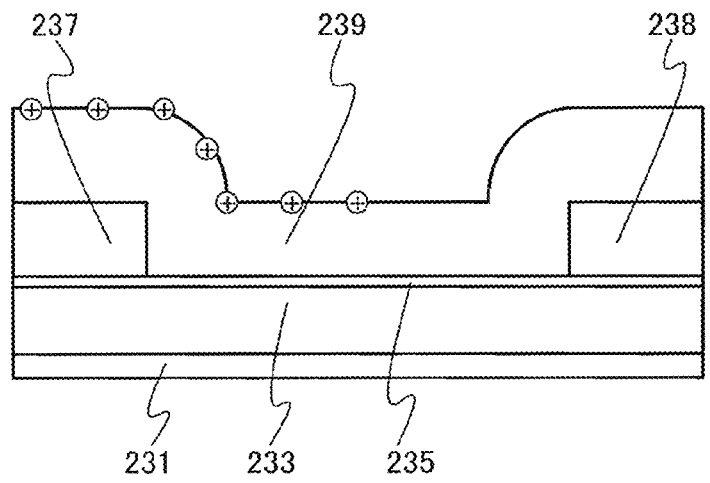

In a transistor illustrated in FIGS. 11A to 11C, a gate insulating film 233 is provided over a gate electrode 231, and an oxide semiconductor film 235 is provided over the gate insulating film 233. A pair of electrodes 237 and 238 are provided over the oxide semiconductor film 235, and an insulating film 239 is provided over the gate insulating film 233, the oxide semiconductor film 235, and the pair of electrodes 237 and 238.

Note that in the calculation, the work function $\phi_m$ of the gate electrode 231 was set to 5.0 eV. The gate insulating film 233 had a stacked-layer structure including a 400-nm-thick film having a dielectric constant of 7.5 and a 50-nm-thick film having a dielectric constant of 4.1. The oxide semiconductor film 235 was a single-layer In—Ga—Zn oxide film (In:Ga:Zn=1:1:1). The band gap $E_g$ of the In—Ga—Zn oxide film was 3.15 eV, the electron affinity $\chi$ was 4.6 eV, the dielectric constant was 15, the electron mobility was 10 cm$^2$/Vs, and the donor density $N_d$ was 1×10$^{13}$/cm$^3$. The work function $\phi_{sd}$ of the pair of electrodes 237 and 238 was set to 4.6 eV. Ohmic junction was made between the oxide semiconductor film 235 and each of the pair of electrodes 207 and 208. The insulating film 239 was a 550-nm-thick film having a dielectric constant of 3.9. Note that defect levels, surface scattering, and the like in the oxide semiconductor film 235 were not considered. Further, the channel length and the channel width of the transistor were 3 μm and 50 μm, respectively.

Next, models of a transistor illustrated in FIG. 11A in which positively charged particles are adsorbed on a surface of the insulating film 239 are illustrated in FIGS. 11B and 11C. FIG. 11B illustrates an assumed structure in which positive fixed charges are uniformly adsorbed on the surface of the insulating film 239. FIG. 11C illustrates an assumed structure in which positive fixed charges are partly adsorbed on the surface of the insulating film 239.

Figure 12A:
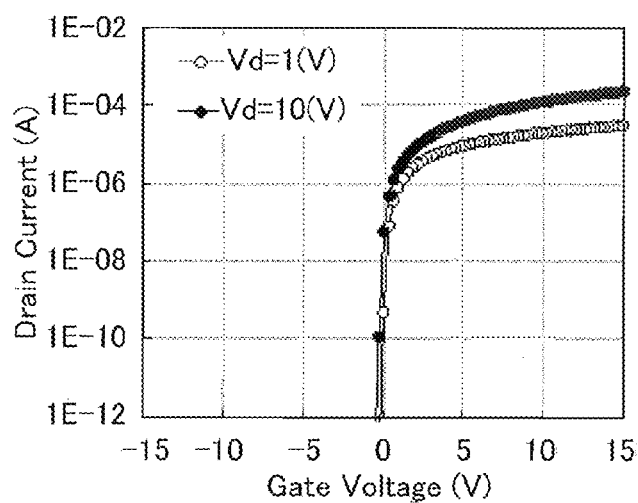
FIGS. 12A to 12C are graphs each showing current-voltage curves obtained by calculation.
Figure 12B:
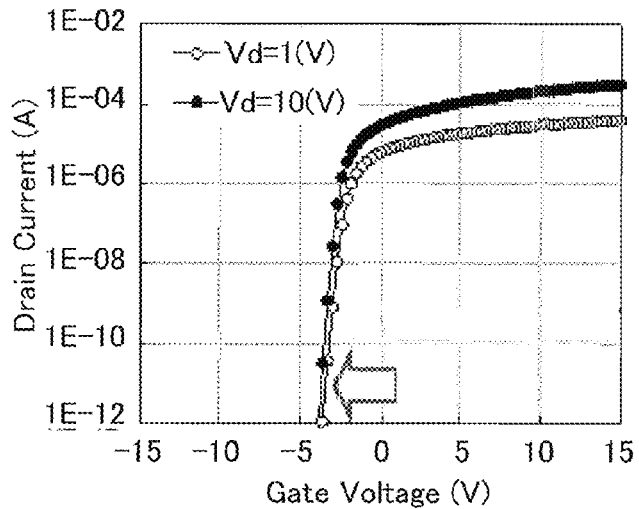
Figure 12C:
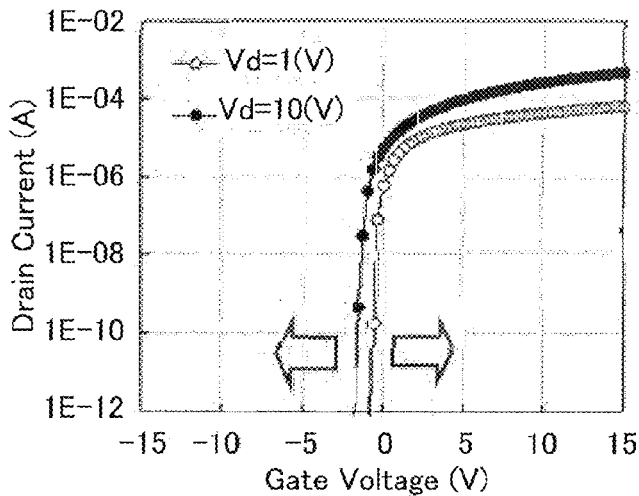

Calculation results of the electrical characteristics of the transistors illustrated in FIGS. 11A to 11C are shown in FIGS. 12A to 12C, respectively.

In the case where it is assumed that no positive fixed charge is adsorbed on the insulating film 239 in the transistor illustrated in FIG. 11A, the rising voltage at a drain voltage $V_d$ of 1 V approximately corresponds to that at a drain voltage $V_d$ of 10 V as shown in FIG. 12A.

In contrast, in the case where it is assumed that positive fixed charges are uniformly adsorbed on the insulating film 239 in the transistor illustrated in FIG. 11B, the threshold voltages shift in the negative direction and the rising voltage at a drain voltage $V_d$ of 1 V approximately corresponds to that at a drain voltage $V_d$ of 10 V as shown in FIG. 12B.

In the case where it is assumed that positive fixed charges are partly adsorbed on the insulating film 239 in the transistor illustrated in FIG. 11C, the rising voltage at a drain voltage $V_d$ of 1 V is different from that at a drain voltage $V_d$ of 10 V as shown in FIG. 12C.

Since the gate electrode 213 is provided in the transistor having Structure 1, as described in <Reduction in degradation due to −GBT stress test>, the gate electrode 213 blocks the electric field of external charged particles; thus, the charged particles do not affect the electrical characteristics of the transistor. In other words, the transistor can be electrically protected against external charges by the gate electrode 213, and changes in the rising voltages of on-state current at different drain voltages can be suppressed.

As described above, in the case where a dual-gate structure is employed and a given voltage is given to each gate electrode, degradation due to a −GBT stress test and changes in the rising voltages of on-state current at different drain voltages can be suppressed. Moreover, in the case where a dual-gate structure is employed and voltages having the same potential are given to each gate electrode, variation in initial characteristics can be reduced, degradation due to a −GBT stress test can be suppressed, and changes in the rising voltages of on-state current at different drain voltages can be suppressed.

Note that the structures, methods, and the like described in this embodiment can be used as appropriate in combination with any of the structures, methods, and the like described in the other embodiments.

Embodiment 4

In any of the transistors described in Embodiments 1 to 3, a base insulating film can be provided between the substrate 11 and the gate electrode 15 as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor film 19 from the substrate 11.

The base insulating film can be formed by a sputtering method, a CVD method, or the like.

Note that the structures, methods, and the like described in this embodiment can be used as appropriate in combination with any of the structures, methods, and the like described in the other embodiments.

Embodiment 5

In any of the transistors described in Embodiments 1 to 4, the gate insulating film 17 can have a stacked-layer structure as necessary. Here, structures of the gate insulating film 17 are described using the transistor 50 described in Embodiment 1 with reference to FIGS. 13A to 13C.

Figure 13A:
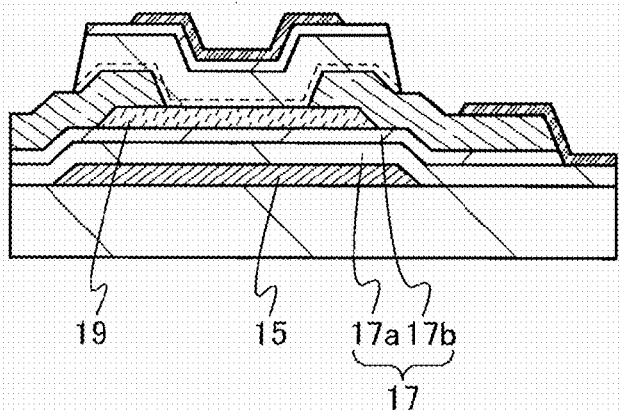
FIGS. 13A to 13C are each a cross-sectional view illustrating one embodiment of a transistor.

As illustrated in FIG. 13A, the gate insulating film 17 can have a stacked-layer structure in which a nitride insulating film 17a and an oxide insulating film 17b are stacked in this order from the gate electrode 15 side. When the nitride insulating film 17a is provided over the gate electrode 15, an impurity, typically hydrogen, nitrogen, alkali metal, alkaline earth metal, or the like, can be prevented from moving from the gate electrode 15 to the oxide semiconductor film 19.

Further, when the oxide insulating film 17b is provided on the oxide semiconductor film 19 side, density of defect states at the interface between the gate insulating film 17 and the oxide semiconductor film 19 can be reduced. Consequently, a transistor whose electrical characteristics are hardly degraded can be obtained. It is preferable to form, as the oxide insulating film 17b, an oxide insulating film containing a higher proportion of oxygen than that of oxygen in the stoichiometric composition like the oxide insulating film 25. This is because density of defect states at the interface between the gate insulating film 17 and the oxide semiconductor film 19 can be further reduced.

Figure 13B:
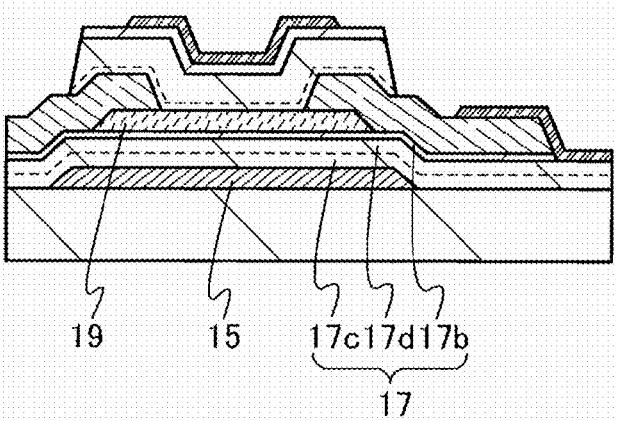

As illustrated in FIG. 13B, the gate insulating film 17 can have a stacked-layer structure in which a nitride insulating film 17c with few defects, a nitride insulating film 17d with a high blocking property against hydrogen, and the oxide insulating film 17b are stacked in this order from the gate electrode 15 side. When the nitride insulating film 17c with few defects is provided in the gate insulating film 17, the withstand voltage of the gate insulating film 17 can be improved. Further, when the nitride insulating film 17d with a high blocking property against hydrogen is provided, hydrogen can be prevented from moving from the gate electrode 15 and the nitride insulating film 17c to the oxide semiconductor film 19.

An example of a method for forming the nitride insulating films 17c and 17d illustrated in FIG. 13B is described below. First, as the nitride insulating film 17c, a silicon nitride film with few defects is formed by a plasma CVD method in which a mixed gas of silane, nitrogen, and ammonia is used as a source gas. Then, as the nitride insulating film 17d, a silicon nitride film in which the hydrogen concentration is low and hydrogen can be blocked is formed by switching the source gas to a mixed gas of silane and nitrogen. By such a formation method, the gate insulating film 17 having a stacked-layer structure of nitride insulating films with few defects and a blocking property against hydrogen can be formed.

Figure 13C:
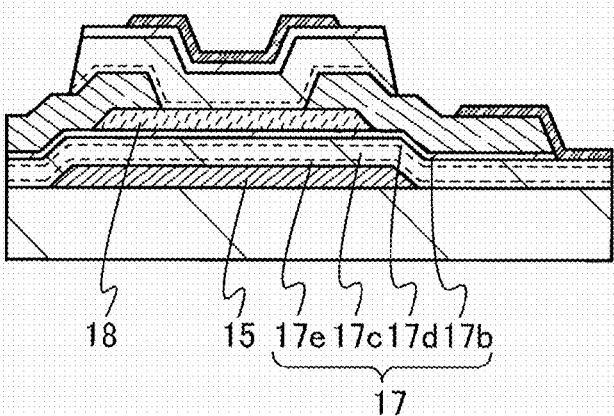

As illustrated in FIG. 13C, the gate insulating film 17 can have a stacked-layer structure in which a nitride insulating film 17e with a high blocking property against an impurity, the nitride insulating film 17c with few defects, the nitride insulating film 17d with a high blocking property against hydrogen, and the oxide insulating film 17b are stacked in this order from the gate electrode 15 side. When the nitride insulating film 17e with a high blocking property against an impurity is provided in the gate insulating film 17, an impurity, typically hydrogen, nitrogen, alkali metal, alkaline earth metal, or the like, can be prevented from moving from the gate electrode 15 to the oxide semiconductor film 19.

An example of a method for forming the nitride insulating films 17e, 17c, and 17d illustrated in FIG. 13C is described below. First, as the nitride insulating film 17e, a silicon nitride film with a high blocking property against an impurity is formed by a plasma CVD method in which a mixed gas of silane, nitrogen, and ammonia is used as a source gas. Then, a silicon nitride film with few defects is formed as the nitride insulating film 17c by increasing the flow rate of ammonia. Then, as the nitride insulating film 17d, a silicon nitride film in which the hydrogen concentration is low and hydrogen can be blocked is formed by switching the source gas to a mixed gas of silane and nitrogen. By such a formation method, the gate insulating film 17 having a stacked-layer structure of nitride insulating films with few defects and a blocking property against an impurity can be formed.

Note that the structures, methods, and the like described in this embodiment can be used as appropriate in combination with any of the structures, methods, and the like described in the other embodiments.

Embodiment 6

Figure 14:
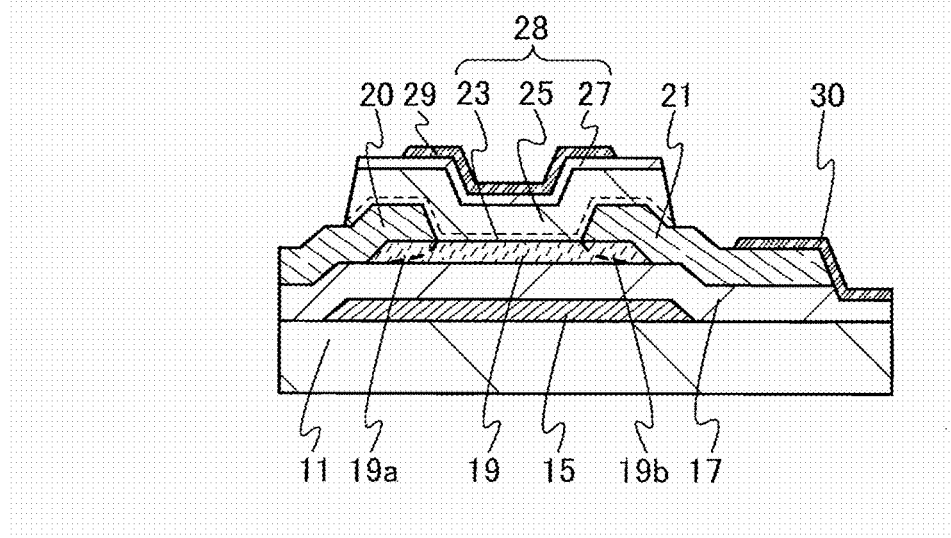
FIG. 14 is a cross-sectional view illustrating one embodiment of a transistor.

As for the pair of electrodes 20 and 21 provided in any of the transistors described in Embodiments 1 to 5, it is possible to use a conductive material that is easily bonded to oxygen, such as tungsten, titanium, aluminum, copper, molybdenum, chromium, or tantalum, or an alloy thereof. Thus, oxygen contained in the oxide semiconductor film 19 and the conductive material contained in the pair of electrodes 20 and 21 are bonded to each other, so that an oxygen vacancy region is formed in the oxide semiconductor film 19. Further, in some cases, part of constituent elements of the conductive material that forms the pair of electrodes 20 and 21 is mixed into the oxide semiconductor film 19. Consequently, as illustrated in FIG. 14, low-resistance regions 19a and 19b are formed in the vicinity of regions of the oxide semiconductor film 19 that are in contact with the pair of electrodes 20 and 21. The low-resistance regions 19a and 19b are formed between the gate insulating film 17 and the pair of electrodes 20 and 21 so as to be in contact with the pair of electrodes 20 and 21. Since the low-resistance regions 19a and 19b have high conductivity, contact resistance between the oxide semiconductor film 19 and the pair of electrodes 20 and 21 can be reduced, and thus, the on-state current of the transistor can be increased.

Further, the pair of electrodes 20 and 21 may each have a stacked-layer structure of the conductive material which is easily bonded to oxygen and a conductive material which is not easily bonded to oxygen, such as titanium nitride, tantalum nitride, or ruthenium. With such a stacked-layer structure, oxidization of the pair of electrodes 20 and 21 can be prevented at the interface between the pair of electrodes 20 and 21 and the oxide insulating film 23, so that the increase of the resistance of the pair of electrodes 20 and 21 can be inhibited.

Note that the structures, methods, and the like described in this embodiment can be used as appropriate in combination with any of the structures, methods, and the like described in the other embodiments.

Embodiment 7

In this embodiment, a semiconductor device having a transistor in which the number of defects in an oxide semiconductor film can be further reduced as compared to Embodiments 1 to 6 is described with reference to drawings. The transistor described in this embodiment is different from any of the transistors in Embodiments 1 to 6 in that a multilayer film in which oxide semiconductor films are stacked is provided. Here, details of the transistor are described with reference to Embodiment 1.

FIGS. 15A to 15D are a top view and cross-sectional views of a transistor 70 included in the semiconductor device. FIG. 15A is a top view of the transistor 70, FIG. 15B is a cross-sectional view taken along dashed line A-B of FIG. 15A, and FIG. 15C is a cross-sectional view taken along dashed line C-D of FIG. 15A. Note that in FIG. 15A, the substrate 11, the gate insulating film 17, the oxide insulating film 23, the oxide insulating film 25, the nitride insulating film 27, and the like are omitted for simplicity.

The transistor 70 illustrated in FIG. 15A to 15C includes the gate electrode 15 over the substrate 11; the gate insulating film 17; a multilayer film 47 overlapping with the gate electrode 15 with the gate insulating film 17 positioned therebetween; the pair of electrodes 20 and 21 in contact with the multilayer film 47; the gate insulating film 28 over the gate insulating film 17, the multilayer film 47, and the pair of electrodes 20 and 21; and the gate electrode 29 over the gate insulating film 28 and the gate insulating film 17. Further, the gate insulating film 28 includes the oxide insulating film 23, the oxide insulating film 25, and the nitride insulating film 27. Furthermore, the electrode 30 connected to one of the pair of electrodes 20 and 21 (here, the electrode 21) is formed over the gate insulating film 17. Note that the electrode 30 serves as a pixel electrode.

In the transistor 70 described in this embodiment, the multilayer film 47 includes the oxide semiconductor film 19 and an oxide semiconductor film 49a. That is, the multilayer film 47 has a two-layer structure. Further, part of the oxide semiconductor film 19 serves as a channel region. Furthermore, the oxide insulating film 23 is formed in contact with the multilayer film 47. The oxide semiconductor film 49a is provided between the oxide semiconductor film 19 and the oxide insulating film 23. The oxide insulating film 25 is formed in contact with the oxide insulating film 23.

The oxide semiconductor film 49a is an oxide film containing one or more elements that form the oxide semiconductor film 19. Thus, interface scattering is unlikely to occur at the interface between the oxide semiconductor films 19 and 49a. Thus, the transistor can have a high field-effect mobility because the movement of carriers is not hindered at the interface.

The oxide semiconductor film 49a is typically an In—Ga oxide film, an In—Zn oxide film, or an In-M-Zn oxide film (M represents Al, Ga, Y, Zr, La, Ce, or Nd). The energy at the conduction band bottom of the oxide semiconductor film 49a is closer to a vacuum level than that of the oxide semiconductor film 19 is, and typically, the difference between the energy at the conduction band bottom of the oxide semiconductor film 49a and the energy at the conduction band bottom of the oxide semiconductor film 19 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 49a and the electron affinity of the oxide semiconductor film 19 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 49a preferably contains In because carrier mobility (electron mobility) can be increased.

When the oxide semiconductor film 49a contains a larger amount of Al, Ga, Y, Zr, La, Ce, or Nd in an atomic ratio than the amount of In in an atomic ratio, any of the following effects may be obtained: (1) the energy gap of the oxide semiconductor film 49a is widened; (2) the electron affinity of the oxide semiconductor film 49a decreases; (3) an impurity from the outside is blocked; (4) an insulating property of the oxide semiconductor film 49a increases as compared to that of the oxide semiconductor film 19; and (5) oxygen vacancies are less likely to be generated because Al, Ga, Y, Zr, La, Ce, or Nd is a metal element that is strongly bonded to oxygen.

In the case where the oxide semiconductor film 49a is an In-M-Zn oxide film, the proportions of In and M when summation of In and M is assumed to be 100 atomic % are as follows: the atomic percentage of In is less than 50 atomic % and the atomic percentage of M is greater than or equal to 50 atomic %; or the atomic percentage of In is less than 25 atomic % and the atomic percentage of M is greater than or equal to 75 atomic %.

Further, in the case where each of the oxide semiconductor films 19 and 49a is an In-M-Zn oxide film (M represents Al, Ga, Y, Zr, La, Ce, or Nd), the proportion of M atoms (M represents Al, Ga, Y, Zr, La, Ce, or Nd) in the oxide semiconductor film 49a is higher than that in the oxide semiconductor film 19. Typically, the proportion of M in the oxide semiconductor film 49a is 1.5 or more times, twice or more, or three or more times as high as that in the oxide semiconductor film 19.

Furthermore, in the case where each of the oxide semiconductor films 19 and 49a is an In-M-Zn-based oxide film (M represents Al, Ga, Y, Zr, La, Ce, or Nd), when $In:M:Zn=x_1:y_1:z_1$ [atomic ratio] is satisfied in the oxide semiconductor film 49a and $In:M:Zn=x_2:y_2:z_2$ [atomic ratio] is satisfied in the oxide semiconductor film 19, $y_1/x_1$ is higher than $y_2/x_2$, or $y_1/x_1$ be 1.5 or more times as high as $y_2/x_2$. Alternatively, $y_1/x_1$ be twice or more as high as $y_2/x_2$. Further alternatively, $y_1/x_1$ be three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 19 is an In-M-Zn oxide film (M is Al, Ga, Y, Zr, La, Ce, or Nd) and a target having the atomic ratio of metal elements of $In:M:Zn=x_1:y_1:z_1$ is used for forming the oxide semiconductor film 19, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 19 is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 49a is an In-M-Zn oxide film (M is Al, Ga, Y, Zr, La, Ce, or Nd) and a target having the atomic ratio of metal elements of $In:M:Zn=x_2:y_2:z_2$ is used for forming the oxide semiconductor film 49a, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 49a is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

Note that a proportion of each atom in the atomic ratio of the oxide semiconductor films 19 and 49a varies within a range of ±40% as an error.

The oxide semiconductor film 49a also serves as a film that relieves damage to the oxide semiconductor film 19 at the time of forming the oxide insulating film 25 later.

The thickness of the oxide semiconductor film 49a is greater than or equal to 3 nm and less than or equal to 100 nm, or greater than or equal to 3 nm and less than or equal to 50 nm.

The oxide semiconductor film 49a may have a non-single-crystal structure, for example, like the oxide semiconductor film 19. The non-single crystal structure includes a CAAC-OS that is described later, a polycrystalline structure, a microcrystalline structure described later, or an amorphous structure, for example.

The oxide semiconductor film 49a may have an amorphous structure, for example. An amorphous oxide semiconductor film, for example, has disordered atomic arrangement and no crystalline component. Alternatively, an amorphous oxide film is, for example, absolutely amorphous and has no crystal part.

Note that the oxide semiconductor films 19 and 49a may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, in some cases, the mixed film has a stacked-layer structure in which two or more of the following regions are stacked: a region having an amorphous structure, a region having a microcrystalline structure, a region having a polycrystalline structure, a CAAC-OS region, and a region having a single-crystal structure.

Here, the oxide semiconductor film 49a is provided between the oxide semiconductor film 19 and the oxide insulating film 23. Hence, if trap states are formed between the oxide semiconductor film 49a and the oxide insulating film 23 owing to impurities and defects, electrons flowing in the oxide semiconductor film 19 are less likely to be captured by the trap states because there is a distance between the trap states and the oxide semiconductor film 19. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 19 and the trap states, capture of the electrons by the trap states can be reduced, and accordingly change in the threshold voltage can be reduced.

Impurities from the outside can be blocked by the oxide semiconductor film 49a, and accordingly, the amount of impurities that are transferred from the outside to the oxide semiconductor film 19 can be reduced. Further, an oxygen vacancy is less likely to be formed in the oxide semiconductor film 49a. Consequently, the impurity concentration and the number of oxygen vacancies in the oxide semiconductor film 19 can be reduced.

Note that the oxide semiconductor films 19 and 49a are not formed by simply stacking each film, but are formed to form a continuous junction (here, in particular, a structure in which the energy of the bottom of the conduction band is changed continuously between each film). In other words, a stacked-layer structure in which there exist no impurity that forms a defect level such as a trap center or a recombination center at each interface is provided. If an impurity exists between the oxide semiconductor films 19 and 49a that are stacked, a continuity of the energy band is damaged, and the carrier is captured or recombined at the interface and then disappears.

In order to form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 71 illustrated in FIG. 15D, a multilayer film 48 overlapping with the gate electrode 15 with the gate insulating film 17 provided therebetween, and the pair of electrodes 20 and 21 in contact with the multilayer film 48 may be included.

The multilayer film 48 includes an oxide semiconductor film 49b, the oxide semiconductor film 19, and the oxide semiconductor film 49a. That is, the multilayer film 48 has a three-layer structure. The oxide semiconductor film 19 serves as a channel region.

Further, the gate insulating film 17 and the oxide semiconductor film 49b are in contact with each other. That is, the oxide semiconductor film 49b is provided between the gate insulating film 17 and the oxide semiconductor film 19.

The multilayer film 48 and the oxide insulating film 23 are in contact with each other. The oxide semiconductor film 49a and the oxide insulating film 23 are in contact with each other. That is, the oxide semiconductor film 49a is provided between the oxide semiconductor film 19 and the oxide insulating film 23.

The oxide semiconductor film 49b can be formed using a material and a formation method similar to those of the oxide semiconductor film 49a.

It is preferable that the thickness of the oxide semiconductor film 49b be smaller than that of the oxide semiconductor film 19. When the thickness of the oxide semiconductor film 49b is greater than or equal to 1 nm and less than or equal to 5 nm, preferably greater than or equal to 1 nm and less than or equal to 3 nm, the amount of change in threshold voltage of the transistor can be reduced.

In the transistor described in this embodiment, the oxide semiconductor film 49a is provided between the oxide semiconductor film 19 and the oxide insulating film 23. Hence, if trap states are formed between the oxide semiconductor film 49a and the oxide insulating film 23 owing to impurities and defects, electrons flowing in the oxide semiconductor film 19 are less likely to be captured by the trap states because there is a distance between the trap states and the oxide semiconductor film 19. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 19 and the trap states, capture of the electrons by the trap states can be reduced, and accordingly change in the threshold voltage can be reduced.

Impurities from the outside can be blocked by the oxide semiconductor film 49a, and accordingly, the amount of impurities that are transferred from the outside to the oxide semiconductor film 19 can be reduced. Further, an oxygen vacancy is less likely to be formed in the oxide semiconductor film 49a. Consequently, the impurity concentration and the number of oxygen vacancies in the oxide semiconductor film 19 can be reduced.

Further, the oxide semiconductor film 49b is provided between the gate insulating film 17 and the oxide semiconductor film 19, and the oxide semiconductor film 49a is provided between the oxide semiconductor film 19 and the oxide insulating film 23. Thus, it is possible to reduce the concentration of silicon or carbon in the vicinity of the interface between the oxide semiconductor film 49b and the oxide semiconductor film 19, the concentration of silicon or carbon in the oxide semiconductor film 19, or the concentration of silicon or carbon in the vicinity of the interface between the oxide semiconductor film 49a and the oxide semiconductor film 19. Consequently, in the multilayer film 48, the absorption coefficient derived from a constant photocurrent method is lower than $1\times10^{-3}$/cm or lower than $1\times10^{-4}$/cm, and thus density of localized levels is extremely low.

A transistor 71 having such a structure includes very few defects in the multilayer film 48 including the oxide semiconductor film 19, thus, the electrical characteristics of the transistor can be improved, and typically, the on-state current can be increased and the field-effect mobility can be improved. Further, in a BT stress test and a BT photostress test that are examples of a stress test, the amount of change in threshold voltage is small, and thus, reliability is high.

<Band Structure of Transistor>

Next, band structures of the multilayer film 47 provided in the transistor 70 illustrated in FIG. 15B and the multilayer film 48 provided in the transistor 71 illustrated in FIG. 15C are described with reference to FIGS. 16A to 16C.

Here, for example, In—Ga—Zn oxide having an energy gap of 3.15 eV is used as the oxide semiconductor film 19, and In—Ga—Zn oxide having an energy gap of 3.5 eV is used as the oxide semiconductor film 49a. The energy gaps can be measured using a spectroscopic ellipsometer (UT-300 manufactured by HORIBA JOBIN YVON SAS.).

The energy difference between the vacuum level and the top of the valence band (also called ionization potential) of the oxide semiconductor film 19 and the energy difference between the vacuum level and the top of the valence band of the oxide semiconductor film 49a were 8 eV and 8.2 eV, respectively. Note that the energy difference between the vacuum level and the valence band top can be measured using an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 19 and the energy gap therebetween of the oxide semiconductor film 49a were 4.85 eV and 4.7 eV, respectively.

Figure 16A:
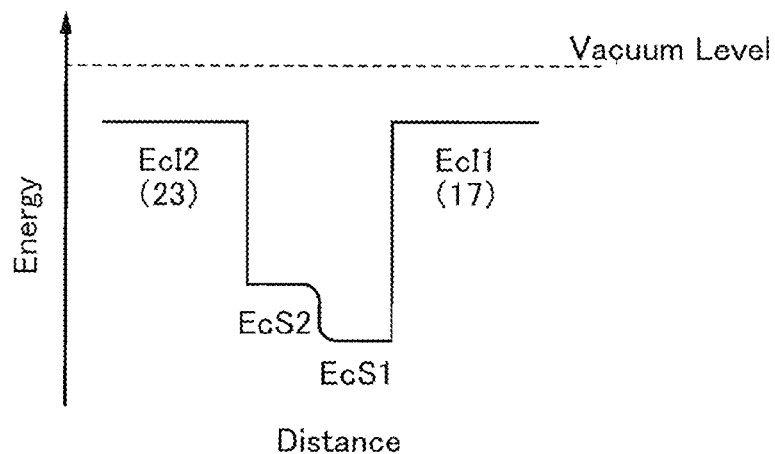
FIGS. 16A to 16C are diagrams illustrating band structures of transistors.

FIG. 16A schematically illustrates a part of the band structure of the multilayer film 47. Here, the case where a silicon oxide film is provided in contact with the multilayer film 47 is described. In FIG. 16A, EcI1 denotes the energy of the bottom of the conduction band in the silicon oxide film; EcS1 denotes the energy of the bottom of the conduction band in the oxide semiconductor film 19; EcS2 denotes the energy of the bottom of the conduction band in the oxide semiconductor film 49a; and EcI2 denotes the energy of the bottom of the conduction band in the silicon oxide film. Further, EcI1 and EcI2 correspond to the gate insulating film 17 and the oxide insulating film 23 in FIG. 15B, respectively.

As illustrated in FIG. 16A, there is no energy barrier between the oxide semiconductor films 19 and 49a, and the energy level of the bottom of the conduction band gradually changes therebetween. In other words, the energy level of the bottom of the conduction band is continuously changed. This is because the multilayer film 47 contains an element contained in the oxide semiconductor film 19 and oxygen is transferred between the oxide semiconductor films 19 and 49a, so that a mixed layer is formed.

As shown in FIG. 16A, the oxide semiconductor film 19 in the multilayer film 47 serves as a well and a channel region of the transistor including the multilayer film 47 is formed in the oxide semiconductor film 19. Note that since the energy of the bottom of the conduction band of the multilayer film 47 is continuously changed, it can be said that the oxide semiconductor films 19 and 49a are continuous.

Although trap states due to impurities or defects might be formed in the vicinity of the interface between the oxide semiconductor film 49a and the oxide insulating film 23 as shown in FIG. 16A, the oxide semiconductor film 19 can be distanced from the trap states owing to the existence of the oxide semiconductor film 49a. However, when the energy difference between EcS1 and EcS2 is small, an electron in the oxide semiconductor film 19 might reach the trap state across the energy difference. When the electron is captured by the trap state, a negative fixed charge is generated at the interface with the oxide insulating film, whereby the threshold voltage of the transistor shifts in the positive direction. Therefore, it is preferable that the energy difference between EcS1 and EcS2 be 0.1 eV or more, more preferably 0.15 eV or more, because change in the threshold voltage of the transistor is reduced and stable electrical characteristics are obtained.

Figure 16B:
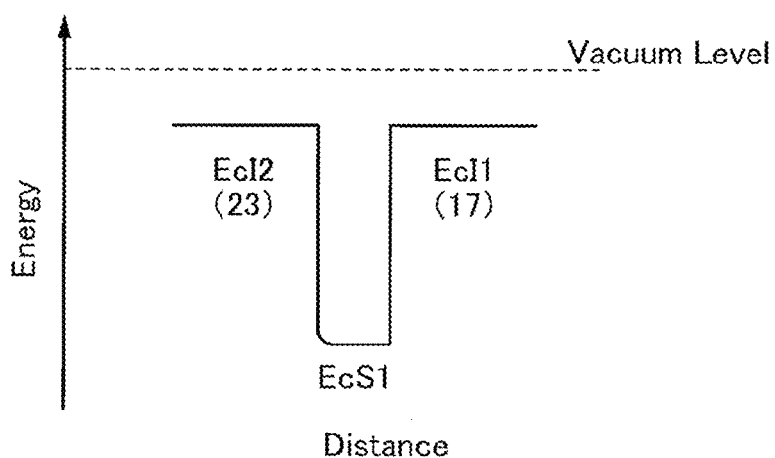

FIG. 16B schematically illustrates a part of the band structure of the multilayer film 47, which is a variation of the band structure shown in FIG. 16A. Here, a structure where silicon oxide films are provided in contact with the multilayer film 47 is described. In FIG. 16B, EcI1 denotes the energy of the bottom of the conduction band in the silicon oxide film; EcS1 denotes the energy of the bottom of the conduction band in the oxide semiconductor film 19; and EcI2 denotes the energy of the bottom of the conduction band in the silicon oxide film. Further, EcI1 and EcI2 correspond to the gate insulating film 17 and the oxide insulating film 23 in FIG. 15B, respectively.

In the transistor illustrated in FIG. 15B, an upper portion of the multilayer film 47, that is, the oxide semiconductor film 49a might be etched in formation of the pair of electrodes 20 and 21. Further, a mixed layer of the oxide semiconductor films 19 and 49a is likely to be formed on the top surface of the oxide semiconductor film 19 in formation of the oxide semiconductor film 49a.

For example, when the oxide semiconductor film 19 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 49a is an oxide semiconductor film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6, the Ga content in oxide semiconductor film 49a is higher than that in the oxide semiconductor film 19. Thus, a GaOx layer or a mixed layer whose Ga content is higher than that in the oxide semiconductor film 19 can be formed on the top surface of the oxide semiconductor film 19.

For that reason, even in the case where oxide semiconductor film 49a is etched, the energy of the bottom of the conduction band of EcS1 on the EcI2 side is increased and the band structure shown in FIG. 16B can be obtained in some cases.

As in the band structure shown in FIG. 16B, in observation of a cross section of a channel region, only the oxide semiconductor film 19 in the multilayer film 47 is apparently observed in some cases. However, a mixed layer that contains Ga more than the oxide semiconductor film 19 does is formed over the oxide semiconductor film 19 in fact, and thus the mixed layer can be regarded as a 1.5-th layer. Note that the mixed layer can be confirmed by analyzing a composition in the upper portion of the oxide semiconductor film 19, when the elements contained in the multilayer film 47 are measured by an EDX analysis, for example. The mixed layer can be confirmed, for example, in such a manner that the Ga content in the composition in the upper portion of the oxide semiconductor film 19 is larger than the Ga content in the oxide semiconductor film 19.

Figure 16C:
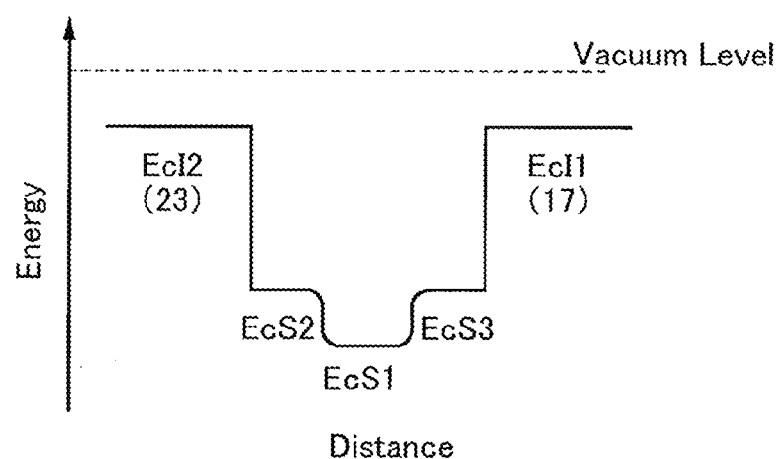

FIG. 16C schematically illustrates a part of the band structure of the multilayer film 48. Here, the case where silicon oxide films are provided in contact with the multilayer film 48 is described. In FIG. 16C, EcI1 denotes the energy of the bottom of the conduction band in the silicon oxide film; EcS1 denotes the energy of the bottom of the conduction band in the oxide semiconductor film 19; EcS2 denotes the energy of the bottom of the conduction oxide semiconductor film 49a; EcS3 denotes the energy of the bottom of the conduction oxide semiconductor film 49b; and EcI2 denotes the energy of the bottom of the conduction band in the silicon oxide film. Further, EcI1 and EcI2 correspond to the gate insulating film 17 and the oxide insulating film 23 in FIG. 15D, respectively.

As illustrated in FIG. 16C, there is no energy barrier between the oxide semiconductor films 49b, 19, and 49a, and the energy level of the bottom of the conduction band gradually changes therebetween. In other words, the energy level of the bottom of the conduction band is continuously changed. This is because the multilayer film 48 contains an element contained in the oxide semiconductor film 19 and oxygen is transferred between the oxide semiconductor films 19 and 49b and between the oxide semiconductor films 19 and 49a, so that a mixed layer is formed.

As shown in FIG. 16C, the oxide semiconductor film 19 in the multilayer film 48 serves as a well and a channel region of the transistor including the multilayer film 48 is formed in the oxide semiconductor film 19. Note that since the energy of the bottom of the conduction band of the multilayer film 48 is continuously changed, it can be said that the oxide semiconductor films 49b, 19, and 49a are continuous.

Although trap states due to impurities or defects might be formed in the vicinity of the interface between the oxide semiconductor film 19 and the oxide insulating film 23 and in the vicinity of the interface between the oxide semiconductor film 19 and the gate insulating film 17, as illustrated in FIG. 16C, the oxide semiconductor film 19 can be distanced from the trap states owing to the existence of the oxide semiconductor films 49a and 49b. However, when the energy difference between EcS1 and EcS2 and the energy difference between EcS1 and EcS3 are small, electrons in the oxide semiconductor film 19 might reach the trap state across the energy difference. When the electrons are captured by the trap state, a negative fixed charge is generated at the interface with the oxide insulating film, whereby the threshold voltage of the transistor shifts in the positive direction. Therefore, it is preferable that the energy difference between EcS1 and EcS2 and the energy difference between EcS1 and EcS3 be 0.1 eV or more, more preferably 0.15 eV or more, because change in the threshold voltage of the transistor is reduced and stable electrical characteristics are obtained.

Note that the structures, methods, and the like described in this embodiment can be used as appropriate in combination with any of the structures, methods, and the like described in the other embodiments.

Embodiment 8

In this embodiment, one embodiment that can be applied to an oxide semiconductor film in the transistor included in the semiconductor device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed of a CAAC-OS film. Furthermore, the oxide semiconductor film may include an amorphous oxide semiconductor and an oxide semiconductor having a crystal grain. Described below are the single-crystal oxide semiconductor, the CAAC-OS, the polycrystalline oxide semiconductor, the microcrystalline oxide semiconductor, and the amorphous oxide semiconductor.

<Single Crystal Oxide Semiconductor>

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC-OS film is greater than or equal to 2500 nm$^2$, greater than or equal to 5 $\mu$m$^2$, or greater than or equal to 1000 $\mu$m$^2$. Further, in a cross-sectional TEM image, when the proportion of the crystal parts is greater than or equal to 50%, greater than or equal to 80%, or greater than or equal to 95% of the CAAC oxide film, the CAAC oxide film is a thin film having physical properties similar to those of a single crystal.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is derived from the (00x) plane (x is an integer) of the InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor that includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Polycrystalline Oxide Semiconductor>

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. When a polycrystalline oxide semiconductor film is analyzed by an out-of-plane method with use of an XRD apparatus, a single peak or a plurality of peaks appear in some cases. For example, in the case of a polycrystalline IGZO film, a peak at 2θ of around 31° that shows alignment or plural peaks that show plural kinds of alignment appear in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film serves as a defect state. Since the grain boundary of the polycrystalline oxide semiconductor film may serve as a carrier generation source or a trap state, a transistor including the polycrystalline oxide semiconductor film has larger variation in electrical characteristics and lower reliability than a transistor including a CAAC-OS film in some cases.

<Microcrystalline Oxide Semiconductor>

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

FIG. 17 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 17 shows that, when a nanobeam electron diffraction is performed on the sample including the nc-OS film, a diffraction pattern exhibiting a crystal plane is obtained, but orientation along a crystal plane in a particular direction is not observed.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that the structures, methods, and the like described in this embodiment can be used as appropriate in combination with any of the structures, methods, and the like described in the other embodiments.

Embodiment 9

In the method for manufacturing any of the transistors described in Embodiments 1 to 8, after the pair of electrodes 20 and 21 are formed, the oxide semiconductor film 19 may be exposed to plasma generated in an oxidizing atmosphere, so that oxygen may be supplied to the oxide semiconductor film 19. Atmospheres of oxygen, ozone, dinitrogen monoxide, nitrogen dioxide, and the like can be given as examples of oxidizing atmospheres. Further, in the plasma treatment, the oxide semiconductor film 19 is preferably exposed to plasma generated with no bias applied to the substrate 11 side. Consequently, the oxide semiconductor film 19 can be supplied with oxygen without being damaged; accordingly, the number of oxygen vacancies in the oxide semiconductor film 19 can be reduced. Moreover, impurities, e.g., halogen such as fluorine or chlorine remaining on a surface of the oxide semiconductor film 19 due to the etching treatment can be removed. The plasma treatment is preferably performed while heating is performed at a temperature higher than or equal to 300° C. Oxygen in the plasma is bonded to hydrogen contained in the oxide semiconductor film 19 to form water. Since the substrate is heated, the water is released from the oxide semiconductor film 19. Consequently, the amount of hydrogen and water in the oxide semiconductor film 19 can be reduced.

Note that the structures, methods, and the like described in this embodiment can be used as appropriate in combination with any of the structures, methods, and the like described in the other embodiments.

Embodiment 10

Although the oxide semiconductor films that are described in the above embodiments can be formed by a sputtering method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film that are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylindium (chemical formula: $In(C_2H_5)_3$) can be used instead of triethylindium, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer or a Ga—Zn—O layer may be formed by mixing of these gases. Note that although an $H_2O$ gas that is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(C_2H_5)_2$ gas may be used.

Note that the structures, methods, and the like described in this embodiment can be used as appropriate in combination with any of the structures, methods, and the like described in the other embodiments.

Embodiment 11

A semiconductor device (also referred to as a display device) having a display function can be manufactured using the transistor examples of which are shown in the above embodiments. Moreover, some or all of the driver circuits that include the transistor can be formed over a substrate where the pixel portion is formed, whereby a system-on-panel can be obtained. In this embodiment, an example of a display device using the transistor examples of which are shown in the above embodiments is described with reference to FIGS. 18A to 18C and FIGS. 19A and 19B. FIGS. 19A and 19B are cross-sectional views illustrating cross-sectional structures taken along dashed-dotted line M-N in FIG. 18B.

Figure 18A:
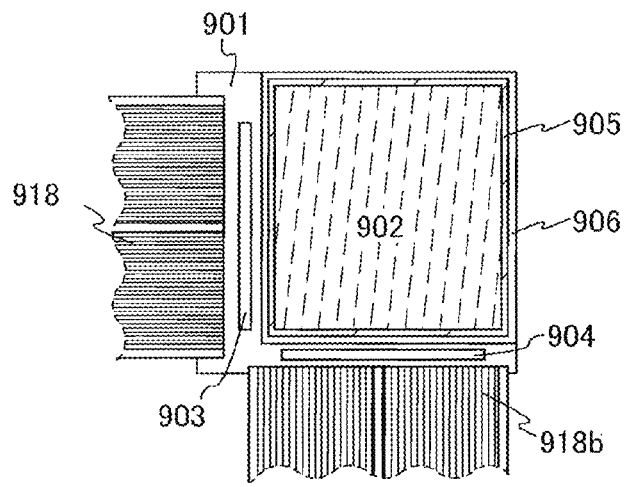
FIGS. 18A to 18C are each a top view illustrating one embodiment of a semiconductor device.
Figure 19A:
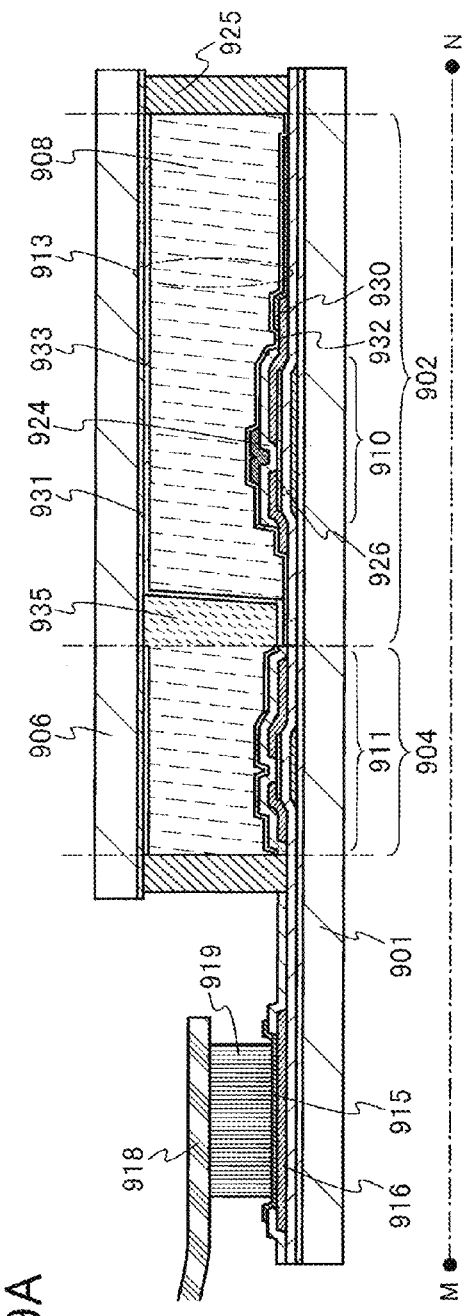
FIGS. 19A and 19B are each a cross-sectional view illustrating one embodiment of a semiconductor device.
Figure 19B:
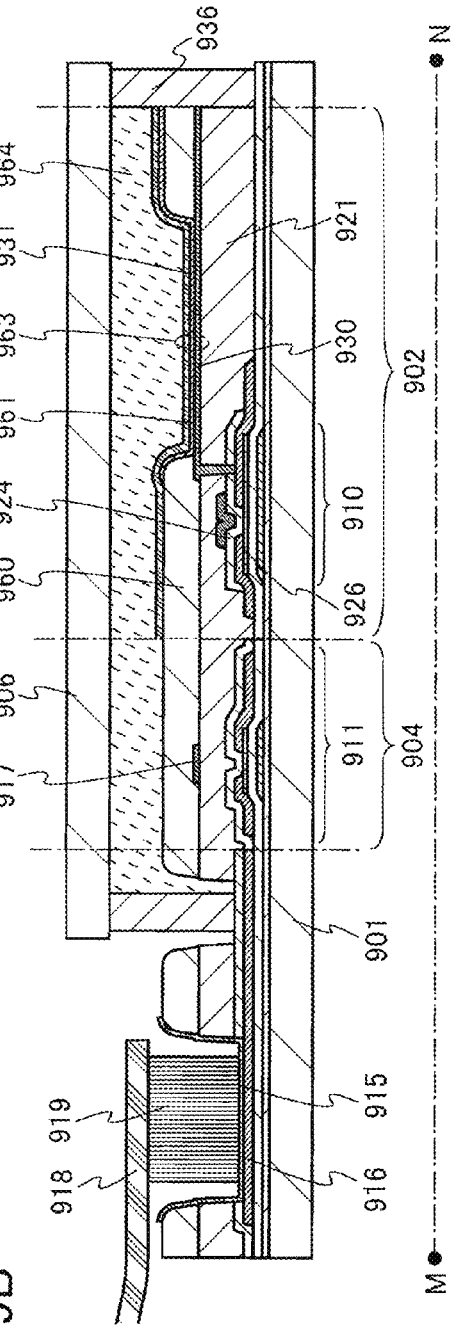

In FIG. 18A, a sealant 905 is provided so as to surround a pixel portion 902 provided over a first substrate 901, and the pixel portion 902 is sealed with a second substrate 906. In FIG. 18A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPC) 918 and 918*b*.

Figure 18B:
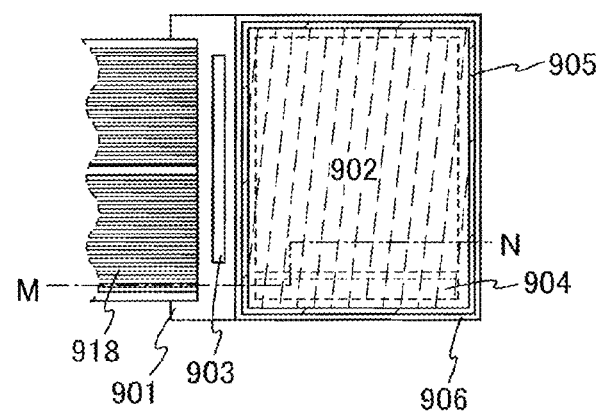
Figure 18C:
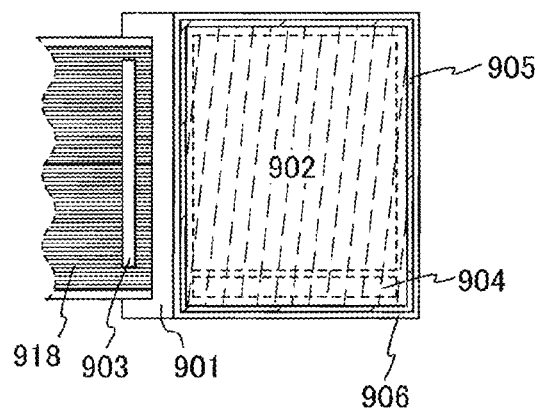

In FIGS. 18B and 18C, the sealant 905 is provided so as to surround the pixel portion 902 and the scan line driver circuit 904 that are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 18B and 18C, a signal line driver circuit 903 that is formed using a single crystal semiconductor or a polycrystalline semiconductor over a substrate separately prepared is mounted in a region different from the region surrounded by the sealant 905 over the first substrate 901. In FIGS. 18B and 18C, various signals and potentials are supplied to the signal line driver circuit 903, the scan line driver circuit 904, and the pixel portion 902 from an FPC 918.

Although FIGS. 18B and 18C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 18A shows an example in which the signal line driver circuit 903 and the scan line driver circuit 904 are mounted by a COG method. FIG. 18B shows an example in which the signal line driver circuit 903 is mounted by a COG method. FIG. 18C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device. Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors that are described in the above embodiments can be used. Any of the transistors described in the above embodiments can be applied to a buffer circuit included in the scan line driver circuit.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used. FIG. 19A illustrates an example of a liquid crystal display device using a liquid crystal element as the display element and FIG. 19B illustrates an example of a light-emitting display device using a light-emitting element as the display element.

As illustrated in FIGS. 19A and 19B, the display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

Each of the pixel portion 902 and the scan line driver circuit 904 that are provided over the first substrate 901 includes a plurality of transistors. FIGS. 19A and 19B illustrate the transistor 910 included in the pixel portion 902 and the transistor 911 included in the scan line driver circuit 904. In FIG. 19A, an insulating film 924 is provided over each of the transistors 910 and 911, and in FIG. 19B, a planarization film 921 is further provided over the insulating film 924.

In this embodiment, any of the transistors described in the above embodiments can be used as the transistors 910 and 911 as appropriate. By using any of the transistors described in the above embodiments as the transistors 910 and 911, a display device with high image quality can be fabricated.

Moreover, FIG. 19B shows an example in which a conductive film 917 is provided over the planarization film 921 so as to overlap with a channel region of an oxide semiconductor film 926 of the transistor 911 for the driver circuit. In this embodiment, the conductive film 917 is formed using the conductive film that is used as the first electrode 930. By providing the conductive film 917 so as to overlap with the channel region of the oxide semiconductor film, the amount of change in the threshold voltage of the transistor 911 between before and after a BT stress test can be further reduced. The conductive film 917 may have the same potential as or a potential different from that of the gate electrode of the transistor 911, and the conductive film 917 can serve as a second gate electrode. The potential of the conductive film 917 may be GND, 0 V, in a floating state, or the same potential or substantially the same potential as the minimum potential (Vss; for example, the potential of the source electrode in the case where the potential of the source electrode is a reference potential) of the driver circuit.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent change in electrical characteristics of the transistor due to the influence of an external electric field such as static electricity. The conductive film 917 can be used for any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

In FIG. 19A, a liquid crystal element 913 that is a display element includes the first electrode 930, a second electrode 931, and a liquid crystal layer 908. Note that an insulating film 932 and an insulating film 933 that serve as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

A spacer 935 is a columnar spacer obtained by selective etching of an insulating film and is provided in order to control the distance between the first electrode 930 and the second electrode 931 (a cell gap). Alternatively, a spherical spacer may be used.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition that includes a liquid crystal showing a blue phase and a chiral material has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by a sealant 925. As the sealant 925, an organic resin such as a thermosetting resin or a photocurable resin can be used.

Further, the transistor including an oxide semiconductor film used in the above embodiments has excellent switching characteristics. Furthermore, relatively high field-effect mobility is obtained, which enables high-speed operation. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

The size of storage capacitor formed in the liquid crystal display device is set considering the leakage current of the transistor provided in the pixel portion or the like so that charges can be held for a predetermined period. By using the transistor including the highly-purified oxide semiconductor film, it is enough to provide a storage capacitor having a capacitance that is ⅓ or less, or ⅕ or less of a liquid crystal capacitance of each pixel; therefore, the aperture ratio of a pixel can be increased.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. One embodiment of the present invention is not limited to the application to a display device for color display but can also be applied to a display device for monochrome display.

In FIG. 19B, a light-emitting element 963 that is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, or the like.

A partition wall 960 can be formed using an organic insulating material or an inorganic insulating material. It is particularly preferable that the partition wall 960 be formed using a photosensitive resin material to have an opening over the first electrode 930 so that a sidewall of the opening has an inclined surface with a continuous curvature.

The light-emitting layer 961 may be formed to have a single-layer structure or a stacked-layer structure including a plurality of layers.

A protective film may be formed over the second electrode 931 and the partition wall 960 in order to prevent oxygen, hydrogen, moisture, carbon dioxide, or the like from entering the light-emitting element 963. As the protective film, a silicon nitride film, a silicon nitride oxide film, an aluminum oxide film, an aluminum nitride film, an aluminum oxynitride film, an aluminum nitride oxide film, a DLC film, or the like can be formed. In addition, in a space that is sealed with the first substrate 901, the second substrate 906, and a sealant 936, a filler 964 is provided and sealed. It is preferable that, in this manner, the light-emitting element be packaged (sealed) with a protective film (such as a laminate film or an ultraviolet curable resin film) or a cover material with high air-tightness and little degasification so that the light-emitting element is not exposed to the outside air.

As the sealant 936, an organic resin such as a thermosetting resin or a photocurable resin, fritted glass including low-melting glass, or the like can be used. The fritted glass is preferable because of its high barrier property against impurities such as water and oxygen. Further, in the case where the fritted glass is used as the sealant 936, as illustrated in FIG. 19B, the fritted glass is provided over the insulating film 924, whereby adhesion of the insulating film 924 to the fritted glass becomes high, which is preferable.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (HO, vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930 and the second electrode 931 can be formed using a conductive composition including a conductive macromolecule (also referred to as a conductive polymer). As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protection circuit is preferably formed using a nonlinear element.

As described above, by using any of the transistors described in the above embodiments, a highly reliable semiconductor device having a display function can be provided.

Note that the structures, methods, and the like described in this embodiment can be used as appropriate in combination with any of the structures, methods, and the like described in the other embodiments and examples.

REFERENCE NUMERALS

11: substrate, 15: gate electrode, 16: insulating film, 17: gate insulating film, 17a: nitride insulating film, 17b: oxide insulating film, 17c: nitride insulating film, 17d: nitride insulating film, 17e: nitride insulating film, 19: oxide semiconductor film, 19a: low-resistance region, 19b: low-resistance region, 19c: dashed line, 19d: dashed line, 20: electrode, 21: electrode, 22: oxide insulating film, 23: oxide insulating film, 24: oxide insulating film, 25: oxide insulating film, 26: nitride insulating film, 27: nitride insulating film, 28: gate insulating film, 28c: opening, 29: gate electrode, 29a: gate electrode, 29b: gate electrode, 30: electrode, 31: gate insulating film, 32: oxide semiconductor film, 33: oxide insulating film, 35: oxide insulating film, 37: nitride insulating film, 38: gate insulating film, 38a: opening, 38b: opening, 38c: opening, 39: gate electrode, 40: electrode, 47: multilayer film, 48: multilayer film, 49a: oxide semiconductor film, 49b: oxide semiconductor film, 50: transistor, 51: transistor, 52: transistor, 60: transistor, 65: transistor, 70: transistor, 71: transistor, 102: conductive film, 201: gate electrode, 203: insulating film, 205: oxide semiconductor film, 207: electrode, 208: electrode, 209: insulating film, 211b: oxide film, 213: gate electrode, 231: gate electrode, 233: gate insulating film, 235: oxide semiconductor film, 237: electrode, 238: electrode, 239: insulating film, 901: substrate, 902: pixel portion, 903: signal line driver circuit, 904: scan line driver circuit, 905: sealant, 906: substrate, 908: liquid crystal layer, 910: transistor, 911: transistor, 913: liquid crystal element, 915: connection terminal electrode, 916: terminal electrode, 917: conductive film, 918: FPC, 919: anisotropic conductive agent, 921: planarization film, 924: insulating film, 925: sealant, 926: oxide semiconductor film, 930: electrode, 931: electrode, 932: insulating film, 933: insulating film, 935: spacer, 936: sealant, 960: partition wall, 961: light-emitting layer, 963: light-emitting element, 964: filler This application is based on Japanese Patent Application serial No. 2013-103708 filed with Japan Patent Office on May 16, 2013, the entire contents of which are hereby incorporated by reference.

What is claimed is:

1. A semiconductor device comprising:
   a transistor comprising:
      a first gate electrode;
      a first gate insulating film over the first gate electrode;
      a first oxide semiconductor film over a first region of the first gate insulating film;
      a source electrode and a drain electrode over the first oxide semiconductor film;
      a second gate insulating film over the first oxide semiconductor film, the source electrode, and the drain electrode; and
      a second gate electrode over the second gate insulating film,
   wherein the second gate electrode is in direct contact with a second region of the first gate insulating film,
   wherein the first oxide semiconductor film is located between the first gate electrode and the second gate electrode,
   wherein the first oxide semiconductor film comprises indium and zinc, and
   wherein a thickness of the first region of the first gate insulating film is larger than a thickness of the second region of the first gate insulating film.

2. The semiconductor device according to claim 1, wherein a side surface of the first oxide semiconductor film faces the second gate electrode in a channel width direction of the transistor.

3. The semiconductor device according to claim 1, wherein the second gate insulating film is in contact with the first gate insulating film.

4. The semiconductor device according to claim 1, wherein the second gate electrode is electrically connected to the first gate electrode through a contact hole provided in the first gate insulating film.

5. The semiconductor device according to claim 1,
   wherein the second gate electrode is electrically connected to the first gate electrode through a first contact hole and a second contact hole each provided in the first gate insulating film, and
   wherein the first oxide semiconductor film is located between the first contact hole and the second contact hole.

6. The semiconductor device according to claim 1, wherein an outline of the first oxide semiconductor film is located inside an outline of the first gate electrode.

7. The semiconductor device according to claim 1, wherein the second gate insulating film comprises:
   a first oxide insulating film;
   a second oxide insulating film over the first oxide insulating film; and a nitride insulating film over the second oxide insulating film.

8. The semiconductor device according to claim 1, wherein the transistor comprises:
   a second oxide semiconductor film over the first gate insulating film; and
   a third oxide semiconductor film over the first oxide semiconductor film,
   wherein the first oxide semiconductor film is located between the second oxide semiconductor film and the third oxide semiconductor film,
   wherein the source electrode and the drain electrode are located over the third oxide semiconductor film, and
   wherein each of the first oxide semiconductor film, the second oxide semiconductor film, and the third oxide semiconductor film comprises indium, gallium, and zinc.

9. The semiconductor device according to claim 1, wherein the transistor is provided over a substrate.

10. A display device comprising:
    a pixel portion comprising:
      a transistor comprising:
        a first gate electrode;
        a first gate insulating film over the first gate electrode;
        a first oxide semiconductor film over a first region of the first gate insulating film;
        a first electrode and a second electrode over the first oxide semiconductor film;
        a second gate insulating film over the first oxide semiconductor film, the first electrode, and the second electrode;
        a second gate electrode over the second gate insulating film; and
        a third electrode in direct contact with the first gate insulating film and the first electrode,
    wherein the second gate electrode is in direct contact with a second region of the first gate insulating film,
    wherein the first oxide semiconductor film is located between the first gate electrode and the second gate electrode,
    wherein the first oxide semiconductor film comprises indium and zinc, and
    wherein a thickness of the first region of the first gate insulating film is larger than a thickness of the second region of the first gate insulating film.

11. The display device according to claim 10, wherein a side surface of the first oxide semiconductor film faces the second gate electrode in a channel width direction of the transistor.

12. The display device according to claim 10, wherein the second gate insulating film is in contact with the first gate insulating film.

13. The display device according to claim 10, wherein the second gate electrode is electrically connected to the first gate electrode through a contact hole provided in the first gate insulating film.

14. The display device according to claim 10,
    wherein the second gate electrode is electrically connected to the first gate electrode through a first contact hole and a second contact hole each provided in the first gate insulating film, and
    wherein the first oxide semiconductor film is located between the first contact hole and the second contact hole.

15. The display device according to claim 10, wherein an outline of the first oxide semiconductor film is located inside an outline of the first gate electrode.

16. The display device according to claim 10, wherein the second gate insulating film comprises:
    a first oxide insulating film;
    a second oxide insulating film over the first oxide insulating film; and
    a nitride insulating film over the second oxide insulating film.

17. The display device according to claim 10,
    wherein the transistor comprises:
      a second oxide semiconductor film over the first gate insulating film; and
      a third oxide semiconductor film over the first oxide semiconductor film,
    wherein the first oxide semiconductor film is located between the second oxide semiconductor film and the third oxide semiconductor film,
    wherein the first electrode and the second electrode are located over the third oxide semiconductor film, and
    wherein each of the first oxide semiconductor film, the second oxide semiconductor film, and the third oxide semiconductor film comprises indium, gallium, and zinc.

18. The display device according to claim 10, wherein the transistor is provided over a substrate.

19. The display device according to claim 10, comprising a liquid crystal layer over the third electrode.

* * * * *